United States Patent [19]

Ishihara et al.

[11] Patent Number: 4,726,963
[45] Date of Patent: Feb. 23, 1988

[54] PROCESS FOR FORMING DEPOSITED FILM

[75] Inventors: Shunichi Ishihara, Ebina; Shigeru Ohno, Yokohama; Masahiro Kanai; Shunri Oda, both of Tokyo; Isamu Shimizu, Yokohama, all of Japan

[73] Assignee: Canon Kabushiki Kaisha, Tokyo, Japan

[21] Appl. No.: 61,003

[22] Filed: Jun. 9, 1987

Related U.S. Application Data

[63] Continuation of Ser. No. 939,229, Dec. 8, 1986, abandoned, which is a continuation of Ser. No. 829,928, Feb. 18, 1986, abandoned.

[30] Foreign Application Priority Data

| Feb. 19, 1985 | [JP] | Japan | 60-31050 |
| Feb. 20, 1985 | [JP] | Japan | 60-32211 |
| Feb. 21, 1985 | [JP] | Japan | 60-33275 |
| Feb. 22, 1985 | [JP] | Japan | 60-34777 |
| Feb. 25, 1985 | [JP] | Japan | 60-35608 |
| Feb. 26, 1985 | [JP] | Japan | 60-36766 |

[51] Int. Cl.⁴ ............................................. B05D 3/06
[52] U.S. Cl. ................................. 427/39; 427/53.1; 437/233; 437/234; 437/238; 437/241
[58] Field of Search ............ 427/38, 39, 45.1, 53.1, 427/86, 87

[56] References Cited

U.S. PATENT DOCUMENTS

| 3,473,978 | 10/1969 | Jackson et al. |
| 3,825,439 | 7/1974 | Tick |
| 3,916,034 | 10/1975 | Tsuchimoto |
| 4,077,818 | 3/1978 | Chu |
| 4,084,024 | 4/1978 | Schumacher |
| 4,217,374 | 8/1980 | Ovshinsky et al. |
| 4,220,488 | 9/1980 | Duchemin et al. |
| 4,282,267 | 8/1981 | Kuyel |
| 4,402,762 | 9/1983 | John et al. |
| 4,410,559 | 10/1983 | Hamakawa et al. |
| 4,419,381 | 12/1983 | Yamazaki |
| 4,430,185 | 2/1984 | Shimomoto et al. |
| 4,434,188 | 2/1984 | Kamo et al. |
| 4,439,463 | 3/1984 | Miller |
| 4,448,801 | 5/1984 | Fukuda et al. ............. 427/87 |
| 4,450,185 | 5/1984 | Shimizu et al. |
| 4,461,783 | 7/1984 | Yamazaki |
| 4,466,992 | 8/1984 | Dreiling |
| 4,468,413 | 8/1984 | Bachmann |
| 4,468,443 | 8/1984 | Shimizu et al. |
| 4,471,042 | 9/1984 | Komatsu et al. |
| 4,485,125 | 11/1984 | Izu et al. |
| 4,504,518 | 3/1985 | Ovshinsky et al. |
| 4,514,437 | 4/1985 | Nath |
| 4,517,223 | 5/1985 | Ovshinsky et al. |
| 4,521,447 | 6/1985 | Ovshinsky et al. |
| 4,522,663 | 6/1985 | Ovshinsky et al. |

(List continued on next page.)

FOREIGN PATENT DOCUMENTS

| 74212 | 3/1983 | European Pat. Off. |
| 90586 | 10/1983 | European Pat. Off. |
| 57-66625 | 4/1982 | Japan |
| 59-199035 | 4/1983 | Japan |
| 2038086A | 7/1980 | United Kingdom |
| 2148328A | 5/1985 | United Kingdom |

OTHER PUBLICATIONS

Brodsky et al., 22, IBM Technical Disclosure Bulletin, 3391 (Jan. 1980).
Janai et al., 52, J. Appl. Phys., 3622 (May 1981).

Primary Examiner—John H. Newsome
Attorney, Agent, or Firm—Fitzpatrick, Cella, Harper & Scinto

[57] ABSTRACT

A process for forming a deposited film comprises introducing into a film forming space housing a substrate therein an active species (A) formed by decomposition of a compound containing germanium and a halogen and an active species (B) formed from a chemical substance for film formation which is reactive with said active species (A) separately from each other, then irradiating them with light energy and thereby allowing both the species to react with each other thereby to form a deposited film on the substrate.

23 Claims, 4 Drawing Figures

U.S. PATENT DOCUMENTS

| | | |
|---|---|---|
| 4,526,805 | 7/1985 | Yashizawa . |
| 4,532,199 | 7/1985 | Ueno et al. ............... 427/37 |
| 4,543,267 | 9/1985 | Yamazaki . |
| 4,544,423 | 10/1985 | Tsuge et al. . |
| 4,546,008 | 10/1985 | Saitoh et al. . |
| 4,554,180 | 11/1985 | Hirooka . |
| 4,564,533 | 1/1986 | Yamazaki . |
| 4,564,997 | 1/1986 | Matsuo et al. . |
| 4,567,127 | 1/1986 | Saitoh et al. . |
| 4,569,697 | 2/1986 | Tsu et al. . |
| 4,582,560 | 4/1986 | Sanjurjo . |
| 4,615,905 | 10/1986 | Ovshinsky . |
| 4,657,777 | 4/1987 | Hirooka . |
| 4,664,937 | 5/1987 | Ovshinsky . |
| 4,689,093 | 8/1987 | Ishihara et al. . |

PROCESS FOR FORMING DEPOSITED FILM

This application is a continuation of application Ser. No. 939,229 filed Dec. 8, 1986 which is a continuation of application Ser. No. 829,928 filed Feb. 18, 1986 both now abandoned.

BACKGROUND OF THE INVENTION

1. Field of the Invention

This invention relates to a process suitable for forming a deposited film, in particular a functional film, above all an amorphous or crystalline deposited film to be used for semiconductor devices, photosensitive devices for electrophotography, line sensors for image input, image pick-up devices, photovoltaic devices, etc.

2. Description of the Prior Art

For example, for formation of an amorphous silicon film, an amorphous germanium film, etc. the vacuum deposition method, the plasma CVD method, the CVD method, the reactive sputtering method, the ion plating method, the optical CVD method or the like have been attempted to be utilized, and, in general, the plasma CVD method has widely been used and industrialized.

However, for the deposited film composed of amorphous silicon, amorphous germanium, etc. there is room for further improvement of overall characteristics, that is, electrical or optical characteristic, fatigue characteristic in repeated use, characteristic for use environment, productivity, mass productivity including uniformity, and reproducibility and the like.

The reaction process in formation of an amorphous silicon deposited film, an amorphous germanium deposited film, etc. according to the plasma CVD method generalized in the prior art is considerably complicated as compared with the conventional CVD method and not a few ambiguities existed in its reaction mechanism. Also, there are involved a large number of parameters for formation of such a deposited film (e.g. substrate temperature, flow rates and ratios of gases introduced, pressure during film formation, high frequency power, electrode structure, structure of reaction vessel, gas discharging speed, plasma generation system, etc.), and the nature of formed plasma depends on such a large number of parameters and sometimes becomes unstable. This often gives markedly bad influences of the deposited film formed. Besides, the parameters associated with an apparatus must be chosen for each apparatus, and it has been difficult under the present situation to standardize the production conditions. On the other hand, for forming an amorphous silicon film, an amorphous germanium film, etc. having satisfactory electrical, optical, photoconductive or mechanical characteristics for respective uses, it has been deemed best to form such a film according to the plasma CVD method under the present situation.

However, in some applied uses of the deposited film, it is required to sufficiently accomplish enlargement of film area, uniformization of film thickness and film quality, etc. and also to perform a mass production with reproducibility by high speed film formation. Thus, in formation of amorphous silicon deposited film, amorphous germanium deposited films, etc. according to the plasma CVD method, enormous investment for mass production equipment is necessary, and operating conditions for mass production is complicated and it makes the tolerance narrower and makes the regulation of apparatuses delicate. These problems have been pointed out to be improved in the future. On the other hand, in the prior art using the conventional CVD method, high temperature is required and no deposited film having practical characteristics could be obtained.

As described above, in formation of amorphous silicon films, amorphous germanium films, etc., it has earnestly been desired to develop a formation process which can perform mass production by means of a low cost apparatus while maintaining practical characteristics and uniformity. These discussions may also be applicable to other functional films such as silicon nitride films, silicon carbide films, silicon oxide films, germanium nitride films, germanium carbide films, germanium oxide films, etc.

SUMMARY OF THE INVENTION

The present invention provides a novel process for formation of a deposited film which removes the drawbacks of the plasma CVD method as described above and does not use conventional film forming methods of the prior art.

An object of the present invention is to provide a process for forming a deposited film which is suitable for enlargement of the film and can easily accomplish improvement of productivity and mass production of the film, while attempting to improve the characteristics of the film formed, the film forming speed and reproducibility and also to uniformize film quality.

According to the present invention, there is provided a process for forming a deposited film, which comprises introducing into a film forming space housing a substrate therein an active species (A) formed by decomposition of a compound containing germanium and a halogen and an active species (B) formed from a chemical substance for film formation which is reactive with said active species (A) separately from each other, then irradiating them with light energy and thereby allowing both the species to react with each other to form a deposited film on the substrate.

DESCRIPTION OF THE PREFERRED EMBODIMENTS

Figure 1:
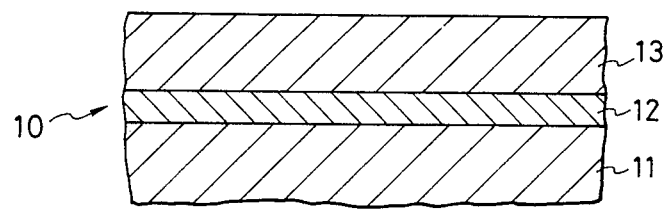
FIG. 1 is a schematic sectional view for illustration of a construction example of the image forming member for electrophotography produced by use of the process of the present invention.

In the process of the present invention, since gases for film formation are excited and reacted by the use of light energy, i.e. in the presence of both active species (A) formed by decomposition of compounds containing germanium and halogens and active species (B) formed from chemical substances for film formation light energy acts on them to cause, accelerate or amplify chemical mutual reactions, deposited films thus formed are free from bad influence by etching action or other actions such as abnormal discharging action, etc.

Also, according to the present invention, by controlling the atmosphere temperature in the film forming space and the substrate temperature as desired, the CVD process can be made more stable.

Moreover, since light energy can be applied equally or selectively to respective active species reaching the proximity of a substrate, or uniformly or to a particular portion of a substrate by means of an appropriate optical system to form a deposited film on the whole surface or a desired portion thereof, and also can be directed only to a given figure portion to form a deposited film thereat, light energy is advantageously employed as an excitation energy.

One of the points in which the process of the present invention is different from the CVD process of the prior art is to use active species obtained by being previously activated in a space different from the film forming space (hereinafter referred to as activation space). By doing so, the film forming speed can be dramatically increased as compared with the CVD method of the prior art. In addition, the substrate temperature during film formation can be lowered to a great extent, whereby deposited films with stable film quality can be provided commercially in a large amount and yet at low cost.

The term active species (A) as herein mentioned refers to those having the action of promoting formation of deposited films by causing chemical mutual actions with the active species (B) formed from a chemical substance for film formation, thereby imparting energy or causing chemical reactions to occur. Thus, the active species (A) may either contain the constituent elements which become the constituent elements constituting the deposited film to be formed or contain no such constituent element.

In the present invention, the active species (A) from the activation space (A) should preferably be selected for use, as desired, from those having a life of 0.1 sec. or longer, more preferably 1 sec. or longer, optimally 10 sec. or longer, from the standpoint of productivity and easiness in handling.

In the present invention, as the compound containing germanium and a halogen to be introduced into the activation space (A), there may be employed, for example, chain or cyclic hydrogenated germaniums of which hydrogen atoms are partially or wholly substituted with halogen atoms, typically chain germanium halides represented by $Ge_uY_{2u+2}$ (u is an integer of 1 or more, and Y is at least one element selected from F, Cl, Br and I); cyclic carbon halides represented by $Ge_vY_{2v}$ (v is an integer of 3 or more, and Y has the same meaning as defined above), and chain or cyclic compounds represented by $Ge_uH_xY_y$ (u and Y have the same meanings as defined above, $x+Y=2u$ or $2u+2$).

Specific examples may include gaseous or readily gasifiable compounds such as $GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, $Ge_2Cl_3F_3$ and the like.

Also, in the present invention, in addition to the active species (A) formed by decomposition of the compound containing germanium and a halogen, it is also possible to use an active species (SX) formed by decomposition of a compound containing silicon and a halogen and/or an active species (CX) formed by decomposition of a compound containing carbon and a halogen in combination.

As the compound containing silicon and a halogen, there may be employed, for example, chain or cyclic hydrogenated silicon of which hydrogen atoms are partially or wholly substituted with halogen atoms, typically chain silicon halides represented by $Si_uZ_{2u+2}$ (u is an integer of 1 or more, Z is at least one element selected from F, Cl, Br and I), cyclic silicon halides represented by $Si_vZ_{2v}$ (v is an integer of 3 or more, and Z has the same meaning as defined above), and chain or cyclic compounds represented by $Si_uH_xZ_y$ (u and Z have the same meanings as defined above, $x+y=2u$ or $2u+2$).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, and the like.

These compounds containing silicon and a halogen may be used alone or as a combination of two or more compounds.

As the compound containing carbon and a halogen to be introduced into the activation space (A), there may be employed, for example, chain or cyclic hydrocarbons of which hydrogen atoms are partially or wholly substituted with halogen atoms, typically chain carbon halides represented by $C_uY_{2u+2}$ (u is an integer of 1 or more, Y is at least one element selected from F, Cl, Br and I) cyclic carbon halides represented by $C_vY_{2v}$ (v is an integer of 3 or more, and Y has the same meaning as defined above), and chain or cyclic compounds represented by $C_uH_xY_y$ (u and Y have the same meanings as defined above, $x+y=2u$ or $2u+2$).

Specific examples may include gaseous or readily gasifiable compounds such as $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CHBr_3$, $CHI_3$, $C_2Cl_3F_3$, and the like.

These compounds containing carbon and a halogen may be used alone or as a combination of two or more compounds.

For formation of the active species (A), in addition to the above compound containing germanium and a halogen (and the compound containing carbon and a halogen or the compound containing silicon and a halogen), other germanium compounds such as single substance of germanium, etc., hydrogen or halogen compounds (e.g., $F_2$ gas, $Cl_2$ gas, gasified $Br_2$, $I_2$, etc.) may be used in combination.

Chemical substances for film formation to be used in the present invention are supplied with activation energy in the activation space (B) to be activated, then introduced to the film forming space, therein excited by the action of light energy, and react mutually with the foregoing active species (A) simultaneously introduced from the activation space (A), thus resulting the easy formation of a desired film on a desired substrate.

In other words, as the chemical substance for film formation for forming the active species (B) used in the present invention, there may be included those containing the constituent elements which become the constituent elements constituting the deposited film to be formed and functioning as a starting material for formation of the deposited film or those not containing the constituent elements which become the constituent elements constituting the deposited film to be formed and capable of being considered to merely contribute to film formation. The compounds functioning as a starting material for formation of the deposited film and the compounds contributing the film formation may be used in combination.

The chemical substance for film formation to be used in the present invention may preferably be already gaseous or made gaseous before introduction into activation space (B). For example, when a liquid compound is used, a suitable gasfying device can be connected to the source for supplying the compound, and the compound can be gasified before introduction into the activation space (B).

In the activation space (B) to be used in the process of the present invention, as the above chemical substance for film formation for forming active species (B), hydrogen gas and/or halogen compounds (e.g. $F_2$ gas, $Cl_2$ gas, gasified $Br_2$, $I_2$, etc.) may be advantageously employed. Also, in addition to these chemical substances for film formation, inert gases such as helium, argon, neon, etc. may be used. When a plurality of these chemical substances for film formation are to be employed, they can be previously mixed before introduction into the activation space (B), or alternatively these chemical substances can individually be supplied from feeding sources independent of each other to be introduced into the activation space (B), or into independent respective activation spaces to be individually activated therein.

In the activation space (B) to be used in the process of the present invention, as the above chemical substance for film formation for forming active species (B), there may also be advantageously employed silicon containing compounds, carbon containing compounds, germanium containing compounds, oxygen containing compounds and nitrogen containing compounds.

As the silicon containing compound, there may be employed unsubstituted or substituted silanes having hydrogen, halogen and hydrocarbon groups bonded to silicon. Above all, chain or cyclic silane compounds and those chain and cyclic silane compounds of which hydrogen atoms are substituted partially or wholly with halogen atoms are preferred.

Specifically, there may be included, for example, straight chain silane compounds represented by $Si_pH_{2p+2}$ (p is an integer of 1 or more, preferably 1 to 15, more preferably 1 to 10) such as $SiH_4$, $Si_2H_6$, $Si_3H_8$, $Si_4H_{10}$, $Si_5H_{12}$, $Si_6H_{14}$, etc. which may be substituted with halogen; branched chain silane compounds represented by $Si_pH_{2p+2}$ (p has the same meaning as mentioned above) such as $SiH_3SiH(SiH_3)SiH_3$, $SiH_3SiH(SiH_3)Si_3H_7$, $Si_2H_5SiH(SiH_3)Si_2H_5$, etc. which may be substituted with halogen; and cyclic silane compounds represented by $Si_qH_{2q}$ (q is an integer of 3 or more, preferably 3 to 6) such as $Si_3H_6$, $Si_4H_8$, $Si_5H_{10}$, $Si_6H_{12}$, etc. which may be substituted with other cyclic silanyl groups and/or chain silanyl groups. Examples of the above silane compounds in which a part or all of the hydrogen atoms are substituted with halogen atoms may include halo-substituted chain or cyclic silane compounds represented by $Si_rH_sX_t$ (X is a halogen atom, r is an integer of 1 or more, preferably 1 to 10, more preferably 3 to 7, $s+t=2r+2$ or $2r$) such as $SiH_3F$, $SiH_3Cl$, $SiH_2Br$, $SiH_3I$, etc. These compounds may be used either alone or as a combination of two or more compounds.

In the above case, in addition to the silicon containing compounds for film formation, it is possible to introduce one or more kinds of the aforesaid hydrogen gas, halogen compounds (e.g. $F_2$ gas, $Cl_2$ gas, gasified $Br_2$, $I_2$, etc.) and inert gases such as helium, argon, neon, etc. into the activation space (B). When a plurality of these chemical substances for film formation are to be employed, they can be previously mixed before introduction into the activation space (B), or alternatively these starting gases can individually be supplied from feeding sources independent of each other to be introduced into the activation space (B), or into independent respective activation spaces to be individually activated therein.

As the carbon containing compound, there may be employed preferably gaseous or readily gasifiable compounds selected from chain or cyclic saturated or unsaturated hydrocarbon compounds, organic compounds containing carbon and hydrogen as main constituent atoms and additionally containing at least one of halogen, sulfur, etc. as constituent atoms, and organic silicon compounds containing hydrocarbon groups as constituent components or having silicon-carbon bonds.

Among them, as hydrocarbon compounds, there may be enumerated saturated hydrocarbons having 1 to 5 carbon atoms, ethylenic hydrocarbons having 2 to 5 carbon atoms, acetylenic hydrocarbons having 2 to 4 carbon atoms, including specifically, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2($C_4H_8$), isobutylene ($C_4H_8$), pentene ($C_5H_{10}$); as acetylenic hydrocarbons, acetylene ($C_2H_2$), methylacetylene ($C_3H_4$), butyne ($C_4H_6$), etc.

As halo-substituted hydrocarbon compounds, there may be enumerated compounds in which at least one of hydrogen atoms which are constituents of the above hydrocarbon compounds are substituted with F, Cl, Br or I, particularly those in which hydrogen is substituted with F or Cl, as effective ones.

The halogens substituted for hydrogen may be either one kind or two or more kinds in one compound.

As organic silicon compounds to be used in the present invention may include organosilanes and organohalogenosilanes.

Organosilanes and organohalogenosilanes are compounds represented, respectively, by the general formulae:

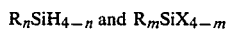

$R_nSiH_{4-n}$ and $R_mSiX_{4-m}$ wherein R is alkyl or aryl; X is F, Cl, Br or I; n=1,2,3 or 4; and m=1,2 or 3, including typically alkylsilanes, arylsilanes, alkylhalogenosilanes, and arylhalogenosilanes.

Specific example of organochlorosilanes include
trichloromethylsilane—$CH_3SiCl_3$,
dichlorodimethylsilane—$(CH_3)_2SiCl_2$,
chlorotrimethylsilane—$(CH_3)_3SiCl$,
trichloroethylsilane—$C_2H_5SiCl_3$ and
dichlorodiethylsilane—$(C_2H_5)_2SiCl_2$.

Specific examples of organochlorofluorosilanes include
chlorodifluoromethylsilane—$CH_3SiF_2Cl$,
dichlorofuloromethylsilane—$CH_3SiFCl_2$,
chlorofulorodimethylsilane—$(CH_3)_2SiFCl$,
chloroethyldifluorosilane—$(C_5H_5)SiF_2Cl$,
dichloroethylfluorosilane—$C_2H_5SiFCl_2$,
chlorodifluoropropylsilane—$C_3H_7SiF_2Cl$ and
dichlorofluoropropylsilane—$C_3H_7SiFCl_2$.

Specific examples of organosilanes include
tetramethylsilane—$(CH_3)_4Si$,
ethyltrimethylsilane—$(CH_3)_3SiC_2H_5$,
trimethylpropylsilane—$(CH_3)_3SiC_3H_7$,
triethylmethylsilane—$CH_3Si(C_2H_5)_3$ and
tetraethylsilane—$(C_2H_5)_4Si$.

Specific examples of organohydrogenosilanes include methylsilane—$CH_3SiH_3$,
dimethylsilane—$(CH_3)_2SiH_2$,
trimethylsilane—$(CH_3)_3SiH$,
diethylsilane—$(C_2H_5)_2SiH_2$,
triethylsilane—$(C_2H_5)_3SiH$,
tripropylsilane—$(C_3H_7)_3SiH$ and
diphenylsilane—$(C_6H_5)_2SiH_2$.

Specific examples of organofluorosilanes include
trifluoromethylsilane—$CH_3SiF_3$,
difluorodimethylsilane—$(CH_3)_2SiF_2$,
fluorotrimethylsilane—$(CH_3)_3SiF$,
ethyltrifluorosilane—$C_2H_5SiF_3$,
diethyldifluorosilane—$(C_2H_5)_2SiF_2$,
triethylfulorosilane—$(C_2H_5)_3SiF$ and
trifluoropropylsilane—$(C_3H_7)SiF_3$.

Specific examples of organobromosilanes include
bromotrimethylsilane—$(CH_3)_3SiBr$ and
dibromodimethylsilane—$(CH_3)_2SiBr_2$.

In addition, it is also possible to use organopolysilanes, for example, organodisilanes such as
hexamethyldisilane—$[(CH_3)_3Si]_2$ and
hexapropyldisilane—$[(C_3H_7)_3Si]_2$.

These carbon containing compounds may be used either alone or as a combination of two or more compounds.

In the above case, in addition to the carbon containing compounds, one or more kinds of hydrogen, halogen compounds (e.g. $F_2$ gas, $Cl_2$ gas, gasified $Br_2$, $I_2$, etc.), inert gases such as helium, neon, argon, etc. and the aforesaid silicon compounds may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the germanium containing compounds, there may be employed inorganic or organic germanium containing compounds having hydrogen, halogens or hydrocarbon groups bonded to germanium, as exemplified by organic germanium compounds such as chain or cyclic hydrogenated germanium represented by $Ge_aH_b$ (a is an integer of 1 or more, $b=2a+2$ or $2a$); polymers of the hydrogenated germanium; compounds in which a part or all of the hydrogen atoms in the above hydrogenated germanium are substituted with halogen atoms; compounds in which a part or all of the hydrogen atoms in the above hydrogenated germanium compounds are substituted with organic groups such as alkyl groups, aryl groups, etc. or, if desired, halogen atoms; etc. and inorganic germanium compounds such as sulfide, imides, etc.

Specifically, there may be enumerated, for example, $GeH_4$, $Ge_2H_6$, $Ge_3H_8$, n-$Ge_4H_{10}$, tert-$Ge_4H_{10}$, $Ge_3H_6$, $Ge_5H_{10}$, $GeH_3F$, $GeH_3Cl$, $GeH_2F_2$, $H_6Ge_6F_6$, $Ge(CH_3)_4$, $Ge(C_2H_5)_4$, $CH_3GeH_3$, $(CH_3)_2GeH$, $(CH_3)_3GeH$, $(C_2H_5)_2GeH_2$, $Ge(C_6H_5)_4$, $Ge(CH_3)_2F_2$, $GeF_2$, $GeF_4$, $GeS$, $Ge_3N_4$, $Ge(NH_2)_2$, etc.

These germanium compounds may be used either alone or as a combination of two or more compounds.

In the above case, in addition to the germanium containing compounds, one or more kinds of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds or carbon containing may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the oxygen containing compound, there may be mentioned compounds oxygen atoms and at least one atom other than oxygen as constituent atoms. Other atoms than oxygen as mentioned above include hydrogen (H), halogens (X=F, Cl, Br or I), sulfur (S), carbon (C), silicon (Si), germanium (Ge), phosphorus (P), boron (B), alkali metals, alkaline earth metals, transition metals, etc. In addition, still other atoms, of elements belonging to the respective groups in the periodic table, which can be bonded to an oxygen atom may be available.

For example, as compounds containing O and H, there may be enumerated $H_2O$, $H_2O_2$, etc.; as compounds containing O and S, oxides such as $SO_2$, $SO_3$, etc.; as compounds containing O and C, oxides such as $CO$, $CO_2$, etc.; as compounds containing O and Si, siloxanes such as disiloxane ($H_3SiOSiH_3$), trisiloxane ($H_3SiOSiH_2OSiH_3$), etc., organoacetoxylilanes such as diacetoxydimethylsilane $(CH_3)_2Si(OCOCH_3)_2$, triacetoxymethylsilane $CH_3Si(OCOCH_3)_3$, etc., alkylalkoxysilanes such as methoxytrimethylsilane $(CH_3)_3SiOCH_3$, dimethoxydimethylsilane $(CH_3)_2Si(OCH_3)_2$, trimethoxymethylsilane $CH_3Si(OCH_3)_3$), etc.; organosilanols such as trimethylsilanol $(CH_3)_3SiOH$, dimethylphenyl silanol $(CH_3)_2(C_6H_5)SiOH$, diethylsilanediol $(C_2H_5)_2Si(OH)_2$, etc.; as comounds containing O and Ge, oxides, hydroxides of Ge, germanic acids, organic germanium compounds such as $H_3GeOGeH_3$, $H_3GeOGeH_2OGeH_3$, etc., but the oxygen containing compounds to be used in the present invention are not limited to these compounds.

These oxygen containing compounds may be used either alone or as a combination of two or more compounds.

Also, it is possible to use gases other than these compounds such as $O_2$, $O_3$, etc.

In the above case, in addition to the oxygen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds or germanium containing compounds into the activation space (B). When a plurality of these chemical substances for film formation are to be employed, they can be previously mixed in a gaseous state before introduction into the activation space (B), or alternatively these chemical substances for film formation can individually be supplied from feeding sources independent of each other to be introduced into the activation space (B), or into independent respective activation spaces to be individually activated therein.

As the nitrogen containing compound, there may be included compounds containing nitrogen atoms and at least one atom other than nitrogen as constituent atoms. Other atoms than nitrogen as mentioned above include hydrogen (H), halogens (X=F, Cl, Br or I), sulfur (S), carbon (C), oxygen (O), phosphorus (P), silicon (Si), germanium (Ge), boron (B), alkali metals, alkaline earth metals, transition metals, etc. In addition, still other atoms, of elements belonging to the respective groups in the periodic table, which can be bonded to an nitrogen atom may be available.

For example, as compounds containing N and H, there may be enumerated $NH_3$, $NH_4N_3$, $N_2H_5N_3$, $H_2NNH_2$, primary to tertiary amines, halides of these amines, hydroxylamine, etc.; as compounds containing N and X, $N_3X$, $N_2X_2$, $NX_3$, $NOX$, $NO_2X$, $NO_3X_4$, etc.; as compounds containing N and S, $N_4S_4$, $N_2S_5$, etc.; as compounds containing N and C, $N(CH_3)_3$, HCN and cyanides, HOCN and salts thereof, etc.; as compounds containing N and O, $N_2O$, NO, $NO_2$, $N_2O_3$, $N_2O_4$, $N_2O_5$, $NO_3$, etc; as compounds containing N and P, $P_3N_5$, $P_2N_3$, PN, etc. In addition, there may also be employed organosilazanes such as triethylsilazane $(C_2H_5)_3SiNH_2$, hexamethyldisilazane $[(CH_3)_3Si]_2NH$, hexaethyldisilazane $[(C_2H_5)_3Si]_2NH$, etc.; organosilicon isocyanates such as trimethylsilicon isocyanate $(CH_3)_3SiNCO$, dimethylsilicon diisocyanate $(CH_3)_2Si(NCO)_2$, etc.; organosilicon isothiocyanates such as trimethylsilicon isothiocyanate $(CH_3)_3SiNCS$, etc. The nitrogen containing compound is not limited to these compounds provided that the compound is fit for attaining the object of the present invention.

These nitrogen containing compounds may be used either alone or as a combination of two or more compounds. Also, it is possible to use $N_2$ gas.

In the above case, in addition to the nitrogen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds, germanium containing compounds or oxygen containing compounds into the activation space (B). When a plurality of these chemical substances for film formation are to be employed, they can be previously mixed in a gaseous state before introduction into the activation space (B), or alternatively these chamical substances for film formation can individually be supplied from feeding sources independent of each other to be introduced into the activation space (B), or into independent respective activation spaces to be individually activated therein.

In the present invention, the proportion in amount of the active species (A) to the active spacies (B) in the film forming space may suitably be determined depending on the depositing conditions, the kind of activated species, etc., but may preferably be 10:1 to 1:10, more preferably 8:2 to 4:6.

In the present invention, as the method for forming activate species (A) and (B) in the activation spaces (A) and (B), respectively, there may be employed various activation energies such as electrical energies including microwave, RF, low frequency, DC, etc., heat energies including heater heating, IR-ray heating, etc., optical energies and the like in view of the respective conditions and the device.

On the other hand, the deposited film formed according to the present invention can be doped with impurity elements during or after film formation. As the impurity elements to be used, there may be employed, as p-type impurities, elements belonging to group III A of the periodic table such as B, Al, Ga, In, Tl, etc. and, as n-type imputities, elements belonging to group VA of the periodic table such as N, P, As, Sb, Bi, etc. as suitable ones. Particularly, B, Ga, P and Sb are most preferred. The doping amount of impurities may be determined suitably depending on the desired electrical and optical characteristics.

Among compounds containing such impurity atoms as the components, it is preferable to select a compound which is gaseous under normal temperature and normal pressure, or gaseous at least under the activating conditions, or a compound which can be readily gasified by a suitable gasifying device. Such compounds include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.. The compounds containing impurity atoms may be used either alone or as a combination of two or more compounds.

The substances for introduction of impurities may be introduced into the activation space (A) and/or the activation space (B) together with the respective substances for formation of the active species (A) or the active species (B) to be activated therein alternatively activated in a third activation space (C) separate from the activation space (A) and the activation space (B). Also, the substances for introduction of impurities may be directly introduced into the film forming space in gaseous state.

The substance for introduction of impurity can be employed by selecting suitably the activation energy as described above. The active species formed by activation of the substance for introduction of impurity (PN) may be previously mixed with the active species (A) and/or the active species (B) before introduction into the film forming space or independently introduced into the film forming space.

Next, the present invention is described by referring to a typical example of the image forming member for electrophotography formed by the process of the present invention.

FIG. 1 is a schematic sectional view for illustration of the construction example of a typical photoconductive member obtained by the present invention.

Photoconductive member 10 shown in FIG. 1 is applicable as an image forming member for electrophotography, and has a layer constitution consisting of intermediate layer 12 which may optionally be provided and photosensitive layer 13 provided on substrate 11 as a photoconductive member.

In preparation of the photoconductive member 10, the intermediate layer 12 and/or the photosensitive member 13 can be prepared according to the process of the present invention. Further, when the photoconductive member 10 has an protective layer provided for the purpose of protecting chemically or physically the surface of the photosensitive layer 13, or a lower barrier layer and/or an upper barrier layer provided for improving dielectric strength, these layers can also be prepared according to the process of the present invention.

The substrate 11 may be either electroconductive or insulating. As electroconductive substrates, there may be mentioned metals such as NiCr, stainless steel, Al, Cr, Mo, Au, Ir, Nb, Ta, V, Ti, Pt, Pd, etc. or alloys thereof.

As insulating substrates, there may conventionally be used films or sheets of synthetic resins including polyesters, polyethylene, polycarbonates, cellulose acetate, polypropylene, polyvinyl chloride, polyvinylidene chloride, polystyrene, polyamides, etc.; glasses, ceramics, papers and so on. At least one side surface of these substrates is preferably subjected to treatment for imparting electroconductivity, and it is desirable to form other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, In$_2$O$_3$, SnO$_2$, ITO(In$_2$O$_3$+SnO$_2$), etc. thereon. Alternatively, a synthetic resin film such as a polyester film can be subjected to the electroconducitve treatment on its surface by, for example, vacuum vapor deposition, electron-beam deposition or sputtering of a metral such as NiCr, Al, Ag, Pb, Zn, Ni, Au, Cr, Mo, Ir, Nb, Ta, V, Ti, Pt, etc. or by laminating treatment with the said metal, thereby imparting electroconductivity to the surface. The substrate may be shaped in any form such as cylinders, belts, plates or others, and its form may be determined as desired. For example, when the photoconductive member 10 in FIG. 1 is to be used as an image-forming member for electrophotography, it may desirably be formed into an endless belt or a cylinder for use in continuous high speed copying.

For example, the intermediate layer 12 has the function of impeding effectively inflow of the carriers from the side of the substrate 11 into the photosensitive layer 13 and permitting easy passage of the photocarriers, formed in the photosensitive layer 13 by irradiation of electromagnetic wave and migrating toward the side of the substrate 11, from the side of the photosensitive layer 13 to the side of the substrate 11.

The intermediate layer 12 is composed of, for example, amorphous germanium A-Ge(Si, H, X) containing germanium as a matrix and optionally silicon (Si), hydrogen (H), halogens (X) or the like as constituting atoms; amorphous germanium A-GeC(H, X, Si) containing germanium as a matrix and optionally silicon, hydrogen and/or halogens and further containing carbon (C) as constituting atoms; amorphous silicon-germanium A-SiGe (H, X) containing silicon and germanium as a matrix and optionally hydrogen and/or halogens; amorphous silicon-germanium A-SiGe(H, X, O) containing silicon and germanium as a matrix and optionally hydrogen, halogens and/or oxygen (O) as constituting atoms; amorphous silicon-germanium A-SiGeN(H, X) containing silicon and germanium as a matrix and optionally hydrogen and/or halogens and further containing nitrogen; or the like, and in addition may contain p-type impurities such as boron (B) and n-type impurities such as phosphorus (P).

In the present invention, the content of substances controlling conductivity such as B, P, etc. contained in the intermediate layer 12 may preferably be 0.001 to $5\times10^4$ atomic ppm, more preferably 0.5 to $1\times10^4$ atomic ppm, optimally 1 to $5\times10^3$ atomic ppm.

In the case of forming the intermediate layer 12, as starting materials for formation of the intermediate layer, active species (A) formed in activation space (A) and active species (B) formed in activation space (B), optionally together with active species formed by activation of hydrogen, halogens, inert gases, gases of silicon containing compounds, germanium containing compounds, carbon containing compounds, nitrogen containing compounds, compounds containing impurity elements as components, etc. may be introduced respectively and separately, or mixed together if desired, into the film forming space, in which the substrate 11 is placed, and the intermediate layer 12 may be formed on the substrate 11 by causing a chemical reaction by the action of light energy.

The compound containing germanium and a halogen capable of forming active species (A) by introduction into the activation space (A) during formation of the intermediate layer 12 should desirably be selected from the aforesaid compounds, particularly those readily forming active species such as GeF$_2$*. Similarly, as the compound containing silicon and halogen, it is desirable to select a compound from the compounds as mentioned above which can form readily active species such as SiF$_2$*. Also, as the compound containing carbon and halogen, it is desirable to select a compound from the compounds as mentioned above which can form readily active species such as CF$_2$*.

The intermediate layer 12 should have a layer thickness preferably 30 Å to 10 $\mu$, more preferably 40 Å to 8 $\mu$, optimally 50 Å to 5 $\mu$.

The photosensitive layer 13 is constituted of, for example, an amorphous material having a matrix of silicon atoms and optionally containing hydrogen atoms and/or halogen atoms (X) as constituent atoms (hereinafter referred to as "A-Si(H,X)"); an amorphous material having a matrix of silicon atoms and carbon atoms and optionally containing hydrogen atoms (H) and/or halogen atoms (X) (hereinafter referred to as "A-SiC(H,X); an amorphous material having a matrix of silicon atoms and optionally containing hydrogen, halogen germanium, carbon, etc. as constituent atoms (hereinafter referred to as A-Si(H, X, Ge, C); and amorphous material having a matrix of silicon atoms and germanium atoms optionally containing hydrogen, halogen, carbon, etc. (A-SiGe(H,X,C)) and the like, and has both functions of the charge generation function of generating photocarriers by irradiation of laser beam and the function of transporting the charges.

The photosensitive layer 13 should have a layer thickness preferably of 1 to 100$\mu$, more preferably 1 to 80$\mu$, optimally 2 to 50$\mu$.

The photosensitive layer 13 is, for example, constituted of non-doped, Asi(H,X,Ge,C), Asi(H,X,Ge,C), A-Si(H,X,C), etc, but it may also contain a substance for controlling conductivity characteristic with a polarity different from the polarity of the substance for controlling conductivity characteristic contained in the intermediate layer 12 (e.g. n-type), if desired, or a substance of the same polarity may be contained therein, when the practical amount contained in the intermediate layer 12 is much, in an amount by far smaller than said amount.

Formation of the photosensitive layer 13 may be performed, similarly as in the case of the intermediate layer 12, if it is to be prepared according to the process of the present invention, by introducing a compound containing germanium and halogen and, if desired, a compound containing silicon and halogen into the activation space (A), decomposing these under a high temperature or exciting these through the application of discharging energy or light energy to form active species (A) and introducing said active species (A) into deposition space.

In the case of forming an intermediate layer 12 which is similar to or the same in constituents as the photosensitive layer 13, up to formation of the photoconductive layer 13 can continuously be performed subsequent to formation of the intermediate layer 12.

Further, if desired, it is also possible to form an amorphous deposited film containing carbon and silicon as constituent atoms as the surface layer on the photosensitive layer and, in this case, film formation can also be conducted according to the process of the present invention, similarly as the above intermediate layer and photosensitive layer.

Figure 2:
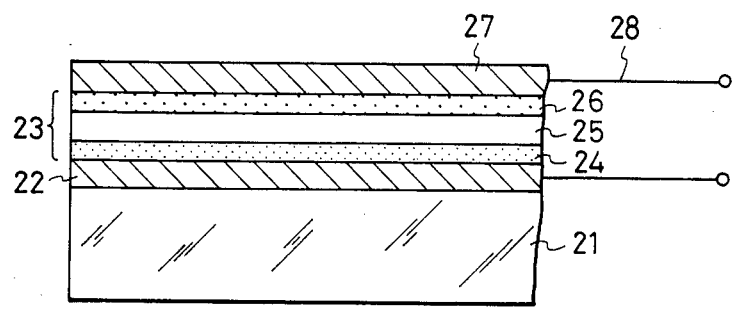
FIG. 2 is a schematic sectional view for illustration of a construction example of a PIN type diode produced by use of the process of the present invention.

FIG. 2 is a schematic illustration showing a typical example of a PIN type diode device utilizing a deposited film doped with an impurity element prepared by carrying out the process of the present invention.

In the drawing, 21 is a substrate, 22 and 27 are thin film electrodes, 23 is a semiconductor film consisting of an n-type semiconductor layer 24, an i-type semiconductor layer 25 and a p-type semiconductor layer 26. 28 is a conductive wire to be connected to the external electrical circuit.

These semiconductor layers are constructed of A-SiGe(H,X), A-SiGe(N,H,X), A-SiGe(O,H,X), A-SiGeC(H,X), A-Si(H,X), A-SiC(H,X) etc. and the present invention may be applicable for preparation for either one of these layers. Particularly, the semiconductor layer 26 can be prepared according to the process of the present invention to enhance convention efficiency.

As the substrate 21, there may be employed a conductive, semiconductive or insulating substrate.

When the substrate 21 is conductive, the thin film electrode 22 may be omitted. As the semiconductive substrate, there may be employed, for example, semiconductors such as Si, Ge, GaAs, ZnO, ZnS, etc.. Thin film electrodes 22, 27 can be obtained by forming thin films of NiCr, Al, Cr, Mo, Au, Ir, Nb, Ta, V, Ti, Pt, Pd, $In_2O_3$, $SnO_2$, ITO($In_2O_3+SnO_2$), etc. on the substrate 21 by treatment such as vacuum deposition, electron beam vapor deposition, sputtering, etc.. The electrodes 22, 27 have a film thickness preferably of 30 to $5\times10^4$ Å, more preferably 100 to $5\times10^3$ Å.

For rendering the film constituting the semiconductor layer n-type or p-type, if desired, it can be formed by doping an n-type impurity or a p-type impurity or both impurities into the layer to be formed, while controlling its amount, during layer formation.

For formation of n-type, i-type and p-type semiconductor layers, any one or all of the layers can be formed by the process of the present invention, with the film formation being performed by introducing a compound containing germanium and halogen and, if desired, compounds containing silicon and halogen or compounds containing carbon and halogen into the activation space (A) and decomposing these by the action of an activation energy, whereby active species (A) of, for example $GeF_2^*$, $SiF_2^*$, $CF_2^*$, etc. can be formed and introduced into the film forming space. Also, separately, chemical substances for film formation introduced into the activation space (B) optionally together with an inert gas and a gas containing an impurity element as the component, may be excited and decomposed, if desired, by respective activation energies to form respective active species, which are then separately or in an appropriate mixture introduced into the film forming space in which substrate 11 is placed. To these active species introduced into the film forming space are applied light energy, and thereby chemical mutual reaction is caused, accelerated or amplified to form a deposited film on the substrate 11. The n-type and p-type semiconductor layers should have a layer thickness preferably of 100 to $10^4$ Å, more preferably 300 to 2000 Å. On the other hand, the i-type semiconductor layer should preferably have a layer thickness preferably of 500 to $10^4$ Å, more preferably 1000 to 10,000 Å.

The PIN type diode device shown in FIG. 2 is not necessarily required to prepare all the layers of P, I and N according to the process of the present invention, but the present invention can be carried out by preparing at least one layer of P, I and N according to the process of the present invention.

Furthermore, the process of the present invention is preferably applicable to, other than the above embodiment, forming $Si_3N_4$ insulator films or partially nitrogenated Si films which are formed by the CVD method and constituting semiconductor devices such as IC's, transistors, diodes, photoelectric conversion devices and the like. Also, Si films having a nitrogen concentration distribution in the layer thickness direction by controlling, for example, the time, the amount, etc. of introducing the nitrogen containing compound into the film forming space. Otherwise, in addition to the nitrogen containing compound, hydrogen, halogens, the silicon containing compounds, the germaium containing compounds, the carbon containing compounds, the oxygen containing compounds, etc. may optionally used to form a film involving bonds of N and H, X, Si, Ge, C, O, etc. as constituting units and having desired characteristics.

According to the process for forming a deposited film of the present invention, electrical, optical photoconductive and mechanical characrtistics desired for the film to be formed can be improved, and yet a high speed film formation is possible without maintaining the substrate at a high temperature. Also, reproducibility in film formation can be improved to enable improvement of the film quality and uniformization of the film quality, and the process is also advantageous in enlargement of area of the film and can easily accomplish improvement of productivity of films as well as bulk production of films. Further, since light energy is used as an excitation energy during film formation, there can be exhibited such effects that film formation can be effected also on a substrate which is poor in heat resistance or susceptible to plasma etching action, and that the steps can be shortened by low temperature treatment.

The present invention is described in detail by referring to the following Examples.

The present invention is described by referring to the following Examples.

EXAMPLE 1

Figure 3:
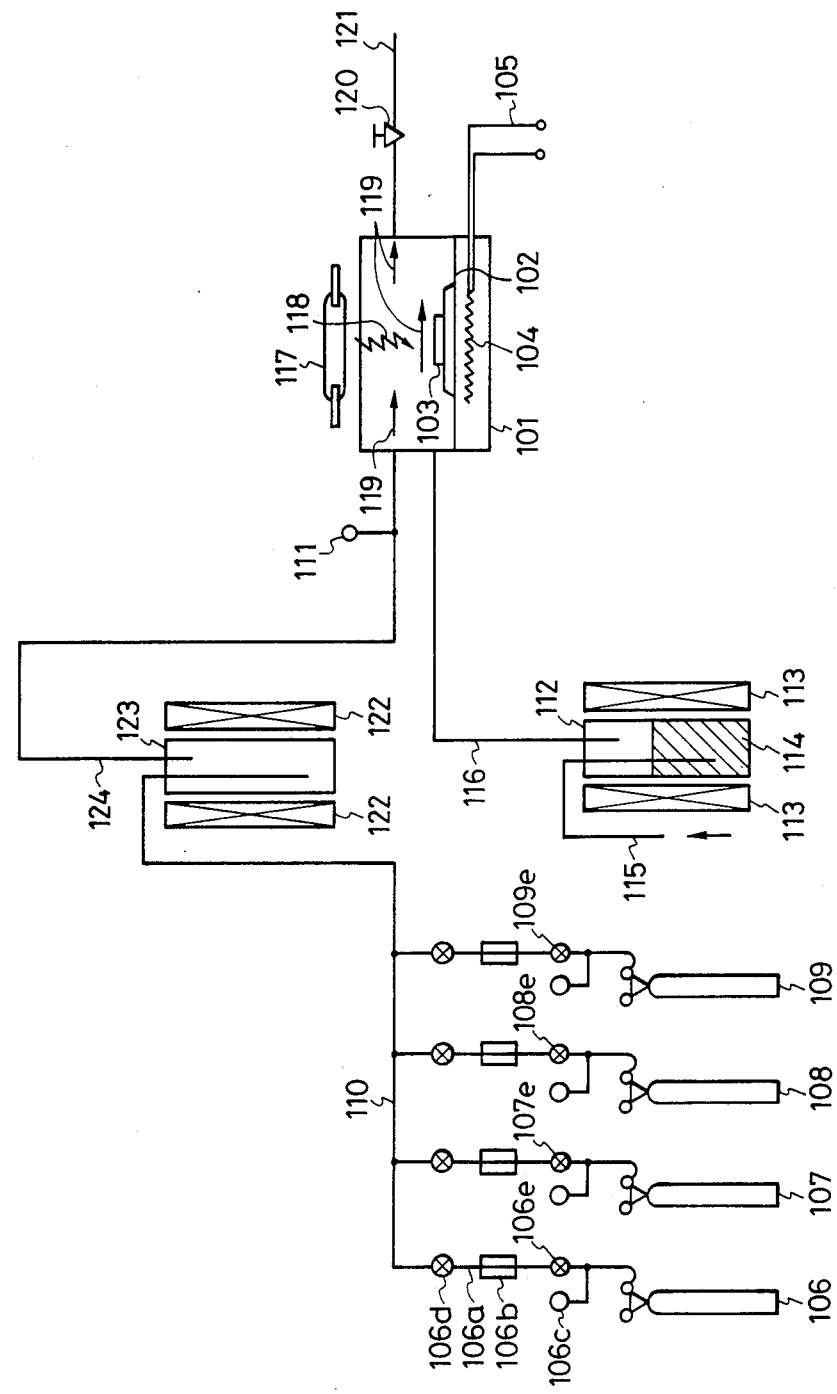
FIG. 3 and FIG. 4 are schematic diagrams for illustration of the constitutions of the devices for practicing the process of the present invention employed in respective examples.

By means of the device as shown in FIG. 3, i-type, p-type and n-type A-Ge (Si, H, X) deposited films were formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 103 before the film forming treatment or, after film formation, for annealing treatment for further improvement of the characteristics of the film formed, and electricity is supplied through a conductive wire 105 to generate heat. Said heater 104 is not driven during film formation.

106 through 109 are gas feeding systems, and they are provided corresponding to the kinds of the gases for film formation, and inert gases optionally employed, and the gases of the compounds containing impurity element as the component. When the gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid Ge particles and 115 a pipe for introduction of a gaseous compound containing germanium and halogen as the starting material for active species (A). The active species (A) formed in the activation chamber 112 is introduced through the inflow pipe 116 into the film forming chamber 101.

Also, when a film containing constituent atoms other than Ge such as Si, etc. is to be formed, an activation chamber (C) not shown similar to 112 may be provided separately, and active species (SX) can be formed from a compound containing silicon and halogen and, for example, Si particles, etc. and introduced into the film forming chamber 101.

117 is a photoenergy generating device and, for example, a mercury lamp, a xenon lamp, carbon dioxide laser, argon ion laser, excimer laser, etc. may be employed.

The light 118 directed to the substrate 103 as a whole or the desired portion of the substrate by use of a suitable optical system from the light-energy generating device 117 is irradiated on the active species flowing in the direction of the arrowhead 119, and the irradiated active species undergo mutually chemical reaction thereby to form a deposited film of A-Ge (Si, H, X) on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device (not shown) to about $10^{-6}$ Torr. From a gas feeding source 106, $H_2$ gas at 150 SCCM or a gas mixture thereof with $PH_3$ gas or $B_2H_6$ gas (each being diluted to 1000 ppm with hydrogen gas) at 40 SCCM was introduced into the activation chamber (B) 123 through the gas inflow pipe 110. $H_2$ gas, etc. introduced into the activation chamber (B) 123 was activated by means of the microwave plasma generating device 122 to be converted to activated hydrogen, etc., which were then introduced through the inflow pipe 124 into the film forming chamber 101.

On the other hand, the activation chamber (A) 102 was packed with solid Ge particles 114, heated by the electric furnace 113, thereby melting Ge, whereinto $GeF_4$ was blown through the inflow pipe 115 from the bomb not shown, thus forming active species of $GeF_2^*$, which were then introduced into the film forming chamber 101 via the inflow pipe 116. Similarly, active species such as $SiF_2^*$ was also introduced into the film forming chamber 101, if desired.

Thus, while maintaining the inner pressure in the film forming chamber 101 at 0.4 Torr, light was irradiated from 1 kW Xe lamp vertically onto the substrate to form a non-doped or doped A-Ge(Si,H,X) film (film thickness 700 Å). The film forming speed was 21 Å/sec.

Subsequently, the non-doped or p-type A-Ge(Si,H,X) film sample obtained was placed in a vacuum deposition tank, wherein a comb-type Al-gap electrode (length 250μ, width 5 mm) was formed under vacuum of $10^{-5}$ Torr, and the dark electroconductivity $\theta_d$ was determined by measuring dark current at an applied voltage of 10 V for evaluation of the film characteristics of the respective samples. The results are shown in Table 1A.

EXAMPLE 2

Except for using a $H_2/F_2$ gas mixture in place of $H_2$ gas from the gas feeding bomb 106, an A-Ge(Si,H,X) film was formed following the same procedure as in Example 1. The dark electroconductivities were measured for respective samples to obtain the results shown in Table 1A.

From Table 1A, it can be seen that A-Ge(Si,H, X) films excellent in electrical characteristics can be obtained according to the present invention and also that A-Ge(Si,H,X) films in which B and P are sufficiently incorporated can be obtained.

EXAMPLE 3

Figure 4:
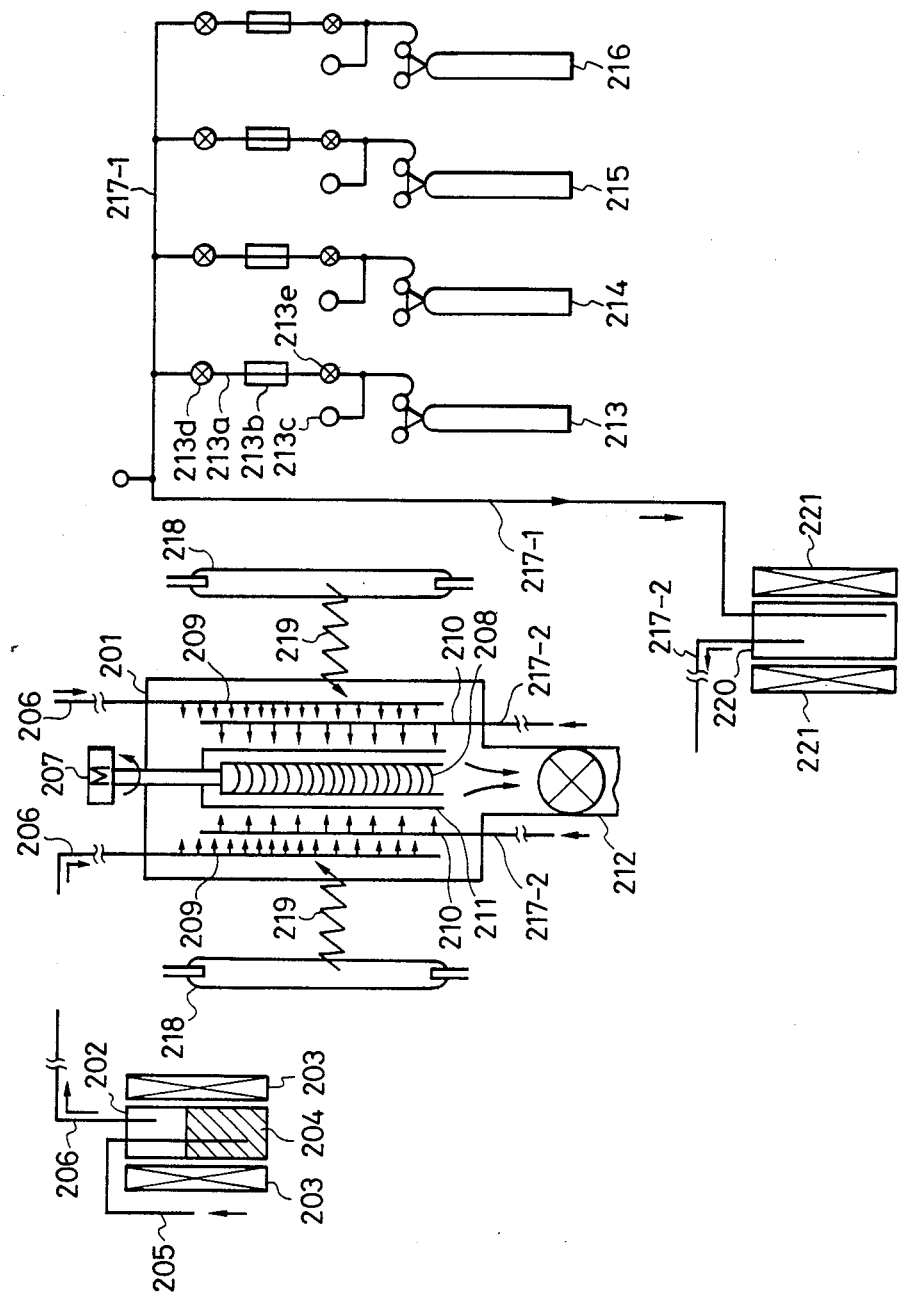

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid Ge particles, 205 an inflow pipe for the starting material of active species (A), 206 a pipe for introducing active species, 207 a motor, 208 a heater which is used similarly as 104 in FIG. 3, 209 and 210 are blowing pipes, 211 is an aluminum cylinder substrate and 212 a gas discharging valve. 213 through 216 are starting gas feeding sources similarly as 106 through 109 in FIG. 1, and 217-1 is a gas inflow pipe.

In the film forming chamber 201, the aluminum cylinder 211 is suspended, equipped internally thereof with the heater 208 so as to be rotatable with the motor 207. 218 is a photoenergy generating device, and light is irradiated toward the desired portion of the aluminum cylinder 211.

Also, the activation chamber (A) 202 was packed with solid Ge particles 204, heated by the electric furnace 203 to bring Ge into red hot state, whereinto $GeF_4$ was blown from the bomb not shown to form active species of $GeF_2^*$, which are then introduced into the film forming chamber 201 via the inflow pipe 206.

Also, from the activation chamber (C) (not shown) having a structure similar to the activation chamber (A) 202, active species (SX) of $SiF_2^*$ were formed from solid Si particles and $SiF_4$ and introduced into the film forming chamber 201.

The $H_2$ gas introduced was subjected to activation treatment such as plasma formation by means of the microwave plasma generating device 220 in the activation chamber (B) 219 to become activated hydrogen, which was then introduced through the inflow pipe 217-2 into the film forming chamber 201. During this operation, if desired, impurity gases such as $PH_3$, $B_2H_6$, etc. were also activated by introduction into the activation chamber (B) 219. While maintaining the pressure in the film forming chamber 201 at 1.0 Torr, light was irradiated from the 1 KW Xe lamp vertically onto the circumferential surface of the aluminum cylinder 211.

The aluminum cylinder 211 was rotated, while the discharging gas was discharged by controlling adequately the opening of the discharging valve 212. Thus, a photosensitive layer 13 was formed.

Also, the intermediate layer 12 was formed to a film thickness of 2000 Å by introducing a gas mixture of $H_2/B_2H_6$ (0.2% of $B_2H_6$ in terms of vol. %) through the inflow pipe 217-1 prior to formation of the photosensitive layer 13.

COMPARATIVE EXAMPLE 1

According to the plasma CVD method in general, an image forming member for electrophotography having a layer constitution as shown in FIG. 1 was formed by use of respective gases of $GeF_4$, $SiF_4$, $H_2$ and $B_2H_6$ by means of the device having the same film forming chamber as the film forming chamber 201 provided with a high frequency generator of 13.56 MHz.

The conditions for preparation of the drumshaped image forming members for electrophotography obtained in Example 3 and comparative example 1 and their performances are shown in Table 2A.

EXAMPLE 4

By means of the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $GeF_2^*$, active species $SiF_2^*$ formed similarly as in Example 1 was introduced into the film forming chamber 101. $H_2$ gas, $PH_3$ gas (diluted to 1000 ppm with hydrogen gas) were respectively introduced into the activation chamber (B) 123 to be activated. Subsequently, the activated gases were introduced through the inflow pipe 116 into the film forming chamber 101. While maintaining the pressure in the film forming chamber 101 at 0.1 Torr, photoirradiation was effected by a 1 KW Xe lamp to form a n-type A-SiGe(H,X) film 24 (film thickness: 700 Å) doped with P.

Next, according to the same method as in formation of the n-type A-SiGe(H,X) film except for stopping introduction of $PH_3$ gas and increasing the value of $SiF_2^*/GeF_2^*$ to three-fold, a non-doped type A-SiGe(H,X) film 25 (film thickness: 5000 Å) was formed.

Subsequently, by use of $B_2H_6$ gas (diluted to 1000 ppm with hydrogen gas) at 40 SCCM together with $H_2$ gas, following otherwise the same condition as in the case of n-type, a p-type A-SiGe(H,X) film 26 (film thickness: 700 Å) doped with b was formed. On this p-type film was further formed by vapor deposition an aluminum electrode 27 with a thickness of 1000 Å to provide a PIN type diode.

The diode element thus obtained (area 1 cm²) was subjected to measurement of I-V characteristic, and rectifying characteristic and photoelectromotive effect were evaluated. The results are shown in Table 3A.

Also, in photoirradiation characteristics, light was introduced from the substrate side, and a conversion efficiency of 8.0% or higher, an open circuit voltage of 0.87 V and a short circuit current of 9.7 mA/cm² were obtained at a photoirradiation intensity AMl (about 100 mW/cm²).

EXAMPLE 5

Except for using respective gases of $H_2$ and $F_2$ ($H_2/F_2=15$) in place of the $H_2$ gas from the inflow pipe 110, the same PIN type diode as in Example 4 was prepared. The rectifying characteristic and photoelectromotive effect were evaluated and the results are shown in Table 3A.

From Table 3A, it can be seen that an amorphous simiconductor PIN type diode having better optical and electrical characteristics as compared with the prior art can be obtained according to the present invention.

EXAMPLE 6

By means of the device as shown in FIG. 3, i-type, p-type and n-type A-GeSi(H,X) deposited films were formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 104 before the film forming treatment or, after film formation, for annealing treatment for further improvement of the characteristics of the film formed, and electricity is supplied through a conductive wire 105 to generate heat. Said heater 104 is not driven during film formation. The heated substrate temperature is not particularly limited, but it should preferably be 50° to 150° C., more preferably 100° to 150° C., in practicing the process of the present invention.

106 through 109 are gas feeding systems, and they are provided corresponding to the kinds of gases of silicon-containing compounds, and hydrogen, halogen compounds, inert gases, gases of the compounds containing impurities as the component which are optionally employed. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid Ge particles and 115 a pipe for introduction of a gaseous compound containing germanium and halogen as the starting material for active species (A). The active species (A) formed in the activation chamber 112 is introduced through the inflow pipe 116 into the film forming chamber 101.

Also, when a film containing constituent atoms other than Ge such as Si, etc. is to be formed, an activation chamber (C) not shown similar to 112 may be provided separately, and active species (SiX*) can be formed from a compound containing silicon and halogen and, for example, Si particles, etc. and introduced into the film forming chamber 101.

117 is a photoenergy generating device and, for example, a mercury lamp, a xenon lamp, carbon dioxide laser, argon ion laser, excimer laser, etc. may be employed.

The light 118 directed to the substrate as a whole or the desired portion of the substrate 103 by use of a suitable optical system from the light-energy generating device 117 is irradiated on the active species flowing in the direction of the arrowhead 119, and the irradiated active species undergo mutually chemical reaction thereby to form a deposited film of A-Si on the whole or the desired portion of the substrate 103. In the drawing, 120 shows a gas discharging valve and 121 a gas discharging pipe.

First, a polyethyleneyterephthalate film 103 was placed on a supporting stand 102, and the film forming chamber 101 was evacuated by use of an evacuating device (not shown) to about $10^{-6}$ Torr. From a gas feeding source 106, $Si_5H_{10}$ at 150 SCCM or a gas mixture thereof with $PH_3$ gas or $B_2H_6$ gas (each being diluted to 1000 ppm with hydrogen gas) at 40 SCCM was introduced into the activation chamber (B) 123 through the gas inflow pipe 110. $Si_5H_{10}$ gas, etc. introduced into the activation chamber (B) 123 was activated by means of the microwave plasma generating device 122 to be converted to activated hydrogen, activated silicon, etc., which were then introduced through the inflow pipe 124 into the film forming chamber 101.

On the other hand, the activation chamber (A) 112 was packed with solid Ge particles 114, heated by the electric furnace 113, thereby bringing Ge into red hot state, whereinto $GeF_4$ was blown through the inflow pipe 115 from the bomb not shown, thus forming active species of $GeF_2^*$, which were then introduced into the film forming chamber 101 via the inflow pipe 116. Similarly, active species such as $SiF_2^*$, etc. were introduced into the film forming chamber 101, if desired.

Thus, while maintaining the inner pressure in the film forming chamber 101 at 0.3 Torr, a non-doped or doped A-Ge(Si,H,X) film (film thickness 700 Å) was formed. The film forming speed was 23 Å/sec.

Subsequently, the non-doped or p-type A-Ge (Si,H,X) film sample was placed in a vacuum deposition tank, wherein a comb-type Al-gap electrode (length 250μ, width 5 mm) was formed under vacuum of $10^{-5}$ Torr, and the dark electroconductivity $\sigma_d$ was determined by measuring dark current at an application voltage of 10 V for evaluation of the film characteristics of the respective samples. The results are shown in Table 1B.

EXAMPLES 7-9

Except for using straight chain $SiH_4$ branched $Si_4H_{10}$ or $H_6Si_6F_6$ in place of $Si_5H_{10}$, A-SiGe(H,X) films were formed, following the same procedures as in Example 6. The dark electroconductivities were measured to obtain the results shown in Table 1B.

From Table 1B, it can be seen that A-SiGe(H,X) films excellent in electrical characteristics can be obtained according to the present invention and also that A-SiGe(H,X) films sufficiently doped can be obtained.

EXAMPLE 10

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid Si particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 1, and 217-1 is a gas introducing pipe.

In the film forming chamber 201, the aluminum cylinder 211 is suspended, equipped internally thereof with the heater 208 so as to be rotatable with the motor 207. 218 is a photoenergy generating device, and light is irradiated toward the desired portion of the aluminum cylinder 211.

Also, the activation chamber (A) 202 was packed with solid Ge particles 204, heated by the electric furnace 203 to bring Ge into red hot state, whereinto $GeF_4$ was blown into to form active species of $GeF_2^*$, which were then introduced into the film forming chamber 201 via the inflow pipe 206.

On the other hand, through the inflow pipe 217-1, $Si_2H_6$ and $H_2$ gases were introduced into the activation chamber (B) 219. The $Si_2H_6$ and $H_2$ gases introduced were subjected to activation treatment such as plasma formation by means of the microwave plasma generating device 220 in the activation chamber (B) 219 to become activated hydrogen, which was then introduced through the inflow pipe 217-2 into the film forming chamber 201. During this operation, if desired, impurity gases such as $PH_3$, $B_2H_6$, etc. were also activated by introduction into the activation chamber (B) 219.

While maintaining the pressure in the film forming chamber 201 at 1.0 Torr, light was irradiated from the 1 KW Xe lamp vertically onto the circumferential surface of the aluminum cylinder 211.

The aluminum cylinder 211 was rotated, while the discharging gas was discharged by controlling adequately the opening of the discharging valve 212. Thus, a photosensitive layer 13 is formed.

Also, the intermediate layer 12 was formed to a film thickness of 2000 Å by introducing a gas mixture of $H_2/B_2H_6$ (0.2% of $B_2H_6$ in terms of vol. %) through the inflow pipe 217-1.

COMPARATIVE EXAMPLE 2

According to the plasma CVD method of the prior art a drum-shaped image forming member for electrophotography having a layer constitution as shown in FIG. 1 was formed by use of respective gases of $Si_2H_6$, $H_2$ and $B_2H_6$ by means of the device having the same film forming chamber as the film forming chamber 201 provided with a high frequency generator of 13.56 MHz.

The conditions for preparation of the drum-shaped image forming members for electrophotography obtained in Example 10 and Comparative example 2 and their performances are shown in Table 2B.

EXAMPLE 11

By means of the device as shown in FIG. 3, with the use of $Si_3H_6$ as the silicon-containing compound, a PIN type diode as shown in FIG. 2 was prepared.

First, a polyetheneterephthalate film 21 having ITO film 22 with a thickness of 1000 Å vapor deposited thereon was placed on a supporting stand and, after reduced to a pressure of $10^{-6}$ Torr, active species GeF$_2$* formed similarly as in Example 6 was respectively introduced into the activation chamber (B) 123 to be activated. Also, from the inflow pipe 110, Si$_3$H$_6$, H$_2$ and PH$_3$ gases (diluted to 1000 ppm with hydrogen gas) were respectively introduced into the activation chamber (B) 123 to be activated.

Next, the activated gases were introduced through the inflow pipe 116 into the film forming chamber 101. While maintaining the pressure in the film forming chamber at 0.1 Torr, an n-type A-SiGe (H,X) film 24 (film thickness 700 Å) doped with P was formed.

Subsequently, except for stopping introduction of PH$_3$, in the same manner as in the case of n-type A-SiGe(H,X) film, a non-doped A-Sic(H,X) film 25 (film thickness: 5000 Å) was formed.

Next, by use of B$_2$H$_6$ gas (diluted to 1000 ppm with hydrogen gas) at 40 SCCM together with H$_2$ gas, following otherwise the same conditions as in the case of the n-type, a p-type A-SiGe(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 cm$^2$) was subjected to measurement of I-V characteristic, and rectifying characteristic and photoelectromotive effect were evaluated. The results are shown in Table 3B.

Also, in photoirradiation characteristics, light was introduced from the substrate side, and a conversion efficiency of 7.8% or higher, an open end voltage of 0.91 V and a short circuit current of 10.2 mA/cm$^2$ were obtained at a photoirradiation intensity AMI (about 100 mW/cm$^2$).

EXAMPLES 12-14

Except for using straight chain Si$_4$H$_{10}$, branched Si$_4$H$_{10}$ or H$_6$Si$_6$F$_6$ in place of Si$_3$H$_6$, the same PIN type diode as in Example 11 was prepared in the same manner as in Example 11. The rectifying characteristic and photoelectromotive effect were evaluated and the results are shown in Table 3B.

From Table 3B, it can be seen that an A-SiGe (H,X) semiconductor PIN type diode having better optical and electrical characteristics as compared with the prior art can be obtained according to the present invention.

EXAMPLE 15

By means of the device as shown in FIG. 3, i-type, p-type and n-type amorphous deposited films containing germanium and carbon were formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 103 before film formation or, after film formation, for annealing treatment for further improvement of the characteristics of the film formed, and electricity is supplied through a conductive wire 105 to generate heat. Said heater 104 is not driven during film formation.

106 through 109 are gas feeding systems, and they are provided corresponding to carbon-containing compounds, and the kinds of gases optionally employed such as hydrogen, halogen compounds, inert gases and compounds containing impurity elements as the component. When these gases employed are liquid under the standard condition, a suitable gasifying device is provided. In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases.

123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101.

111 is a gas pressure gauge. In the drawing, 112 shows an activation chamber (A), 113 an electric furnace, 114 solid Ge particles and 115 a pipe for introduction of a gaseous compound containing germanium and halogen as the starting material for active species (A). The active species (A) formed in the activation chamber 112 is introduced through the inflow pipe 116 into the film forming chamber 101.

117 is a photoenergy generating device and, for example, a mercury lamp, a xenon lamp, carbon dioxide laser, argon ion laser, excimer laser, etc. may be employed.

The light 118 directed to the substrate as a whole or the desired portion of the substrate 103 by use of a suitable optical system from the light-energy generating device 117 is irradiated on the active species flowing in the direction of the arrowhead 119, and the irradiated active species undergo mutually chemical reaction thereby to form a deposited film of A-GeC(H,X) on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device to about $10^{-6}$ Torr. From a gas feeding bomb 106, CH$_4$ gas or a gas mixture thereof with PH$_3$ gas or B$_2$H$_6$ gas (each diluted to 1000 ppm with hydrogen gas) at 40 SCCM was introduced into the activation chamber (B) 123 through the gas inflow pipe 110.

CH$_4$ gas, etc. introduced into the activation chamber (B) 123 was activated by means of the microwave plasma generating device 122 to be converted to hydrogenated carbon active species and active hydrogen, etc., which were then introduced through the inflow pipe 124 into the film forming chamber 101.

On the other hand, the activation chamber (A) 112 was packed with solid GE particles 114, heated by the electric furnace 113, thereby bringing GE into red hot state, whereinto GeF$_4$ was blown through the inflow pipe 115 from the bomb not shown, thus forming active species of GeF$_2$* as active species (A), which were then introduced into the film forming chamber 101 via the inflow pipe 116.

While maintaining the inner pressure in the film forming chamber 101 at 0.4 Torr, light was irradiated from 1 kW Xe lamp vertically onto the substrate to form a non-doped or doped amorphous film containing germanium and carbon (film thickness 700 Å). The film forming speed was 24 Å/sec.

Subsequently, the obtained non-doped or p-type amorphous deposited film sample containing germanium and carbon was placed in a vacuum deposition tank, wherein a comb-type Al-gap electrode (length 250μ, width 5 mm) was formed under vacuum of $10^{-5}$ Torr, and the dark electroconductivity $\sigma_d$ was determined by measuring dark current at an application voltage of 10 V for evaluation of the film characteristics of the respective samples. The results are shown in Table 1C.

EXAMPLES 16-18

Except for using straight $C_2H_6$, $C_2H_4$ or $C_2H_2$ in place of $CH_4$, amorphous deposited films containing germanium and carbon were formed. The dark electroconductivities were measured to obtain the results shown in Table 1C.

From Table 1C, it can be seen that amorphous carbon films containing germanium and carbon excellent in electrical characteristics can be obtained according to the present invention and also that amorphous films containing germanium and carbon sufficiently doped can be obtained.

EXAMPLE 19

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid C particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 1, and 217-1 is a gas introducing pipe.

In the film forming chamber 201, the aluminum cylinder 211 is suspended, equipped internally thereof with the heater 208 so as to be rotatable with the motor 207.

218 is a photoenergy generating device, and light 219 is irradiated toward the desired portion of the aluminum cylinder 211.

Also, the activation chamber (A) 202 was packed with solid Ge particles 204, heated by the electric furnace 203 to bring Ge into red hot state, whereinto $GeF_4$ was blown into to form active species of $GeF_2^*$ as active species (B), which were then introduced into the film forming chamber 201 via the inflow pipe 206.

On the other hand, through the inflow pipe 217-1, $CH_4$, $Si_2H_6$ and $H_2$ gases are introduced into the activation chamber (B) 219.

The $CH_4$, $Si_2H_6$ and $H_2$ gases introduced were subjected to activation treatment such as plasma formation by means of the microwave plasma generating device 220 in the activation chamber (B) 219 to become hydrogenated carbon active species, hydrogenated silicon active species and activated hydrogen, which were then introduced through the inflow pipe 217-2 into the film forming chamber 201. During this operation, if desired, impurity gases such as $PH_3$, $B_2H_6$, etc. were also activated by introduction into the activation chamber (B) 220.

While maintaining the pressure in the film forming chamber 201 at 1.0 Torr, light was irradiated from the 1 KW Xe lamp vertically onto the circumferential surface of the aluminum cylinder 211.

The aluminum cylinder 211 was rotated, while the discharging gas was discharged by controlling adequately the opening of the discharging valve 212. Thus, a photosensitive layer 13 was formed.

Also, the intermediate layer 12 was formed to a film thickness of 2000 Å by introducing a gas mixture of $H_2/B_2H_6$ (0.2% of $B_2H_6$ in terms of vol. %) through the inflow pipe 217-1 prior to formation of the photosensitive layer 13.

COMPARATIVE EXAMPLE 3

According to the plasma CVD method of the prior art an image forming member for electrophotography having a layer constitution as shown in FIG. 1 was formed by use of respective gases of $GeF_4$, $CH_4$, $Si_2H_6$, $H_2$ and $B_2H_6$ by means of the device having the same film forming chamber as the film forming chamber 201 provided with a high frequency generator of 13.56 $MH_z$.

The conditions for preparation of the drum-shaped image forming members for electrophotography obtained in Example 19 and Comparative example 3 and their performances are shown in Table 2C.

EXAMPLE 20

By means of the device as shown in FIG. 3, with the use of $CH_4$ as the carbon compound, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $GeF_2^*$ formed similarly as in Example 15 were introduced into the film forming chamber 101. Also, from the inflow pipe 110, $Si_2H_6$ and $PH_3$ gases (diluted to 1000 ppm with hydrogen gas) were respectively introduced into the activation chamber (B) 123 to be activated. Then, the activated gases were introduced through the inflow pipe 116 into the film forming chamber 101. While maintaining the pressure in the film forming chamber at 0.1 Torr, an n-type a-SiGe(H,X) film 24 (film thickness 700 Å) doped with P was formed by photoirradiation from a 1 KW Xe lamp.

Next, according to the same method as in formation of the n-type a-SiGe(H,X) film except for stopping introduction of $PH_3$ gas, a non-doped type a-SiGe(H,X) film 25 (film thickness: 5000 Å) was formed.

Subsequently, by introducing $CH_4$ and $B_2H_6$ gas (diluted to 1000 ppm with hydrogen gas) together with $Si_3H_6$ gas, following otherwise the same conditions as in the case of n-type, an A-SiGe(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 $cm^2$) was subjected to measurement of I-V characteristic, and rectifying characteristic and photoelectromotive effect were evaluated. The results are shown in Table 3C.

Also, in photoirradiation characteristics, light was introduced from the substrate side, and a conversion efficiency of 8.3% or higher, an open circuit voltage of 0.94 V and a short circuit current of 9.9 $mA/cm^2$ were obtained at a photoirradiation intensity AMI (about 100 mW/cm$^2$).

EXAMPLE 21-23

Except for using straight chain $C_2H_6$, $C_2H_4$ or $C_2H_2$ in place of $CH_4$ as the carbon compound, the same PIN type diode as in Example 20 was prepared in the same manner as in Example 20. The rectifying characteristic and photoelectromotive effect were evaluated and the results are shown in Table 3C.

From Table 3C, it can be seen that carbon-containing A-SiGe(H,X) PIN type diode having better optical and electrical characteristics as compared with the prior art can be obtained according to the present invention.

EXAMPLE 24

By means of the device as shown in FIG. 3, i-type, p-type and n-type a-Ge(H,X) deposited films were formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 103 before the film forming treatment or, after film formation, for annealing treatment for further improvement of the characteristics of the film formed, and electricity is supplied through a conductive wire 105 to generate heat. During film formation, said heater 104 is not driven.

106 through 109 are gas feeding systems, and they are provided corresponding to germanium-containing compounds, and the kinds of gases optionally employed such as hydrogen, halogen compounds, inert gases, silicon-containing compounds, carbon-containing compounds and compounds containing impurity elements as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauses for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid Ge particles and 115 a pipe for introduction of a gaseous compound containing germanium and halogen as the starting material for active species (A). The active species (A) formed in the activation chamber 112 is introduced through the inflow pipe 116 into the film forming chamber 101.

117 is a photoenergy generating device and, for example, a mercury lamp, a xenon lamp, carbon dioxide laser, argon ion laser, excimer laser, etc. may be employed.

The light directed to the substrate as a whole or the desired portion of the substrate 103 by use of a suitable optical system from the light-energy generating device 117 is irradiated on the active species flowing in the direction of the arrowhead 119, and the irradiated active species undergo mutually chemical reaction thereby to form a deposited film of a-Ge(H,X) on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device to about $10^{-6}$ Torr. From a gas feeding source 106, $GeH_4$ gas at 150 SCCM, or a gas mixture thereof with $PH_3$ gas or $B_2H_6$ gas (each diluted to 1000 ppm with hydrogen gas) at 40 SCCM was introduced into the activation chamber (B) 123 through the gas inflow pipe 110.

$GeH_4$ gas, etc. introduced into the activation chamber (B) 123 was activated by means of the microwave plasma generating device 122 to be converted to activated hydrogenated germanium species, etc., which were then introduced through the inflow pipe 124 into the film forming chamber 101.

On the other hand, the activation chamber (A) 122 was packed with solid Ge particles 114, heated by the electric furnace 113, thereby bringing Ge into red hot state, whereinto $GeF_4$ was blown through the inflow pipe 115 from the bomb not shown, thus forming active species of $GeF_2^*$, which were then introduced into the film forming chamber 101 via the inflow pipe 116.

While maintaining the inner pressure in the film forming chamber 101 at 0.4 Torr, irradiation was effected vertically on the substrate 103 from the 1 KW Xe lamp to form non-doped or doped A-Ge(H,X) film (film thickness 700 Å), respectively. The film forming speed was 22 Å/sec.

Subsequently, the non-doped or p-type A-Ge(H,X) film sample obtained was placed in a vacuum deposition tank, wherein a comb-type Al-gap electrode (length 250μ, width 5 mm) was formed under vacuum of $10^{-5}$ Torr, and the dark electroconductivity $\delta_d$ was determined by measuring dark current at an application voltage of 10 V for evaluation of the film characteristics of the respective samples. The results are shown in Table 1D.

EXAMPLES 25-27

Except for using straight chain $Ge_4H_{10}$, branched $Ge_4H_{10}$, or $H_6Ge_6F_6$ in place of $GeH_4$, A-Ge(H,X) films were formed in the same manner as in Example 24. The dark electroconductivities were measured to obtain the results shown in Table 1D.

From Table 1D, it can be seen that A-Ge(H,X) films excellent in electrical characteristics can be obtained and, also a-Ge(H,X) films subjected to satisfactory doping can be obtained according to the present invention.

EXAMPLE 28

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid Ge particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 3, and 217-1 is a gas introducing pipe.

In the film forming chamber 201, the aluminum cylinder 211 is suspended, equipped internally thereof with the heater 208 so as to be rotatable with the motor 207. 218 is a photoenergy generating device, and light is irradiated toward the desired portion of the aluminum cylinder 211.

Also, the activation chamber (A) 202 was packed with solid Ge particles 204, heated by the electric furnace 203 to bring C into red hot state, whereinto $GeF_4$ was blown into to form active species of $GeF_2^*$, which were then introduced into the film forming chamber 201 via the inflow pipe 206.

On the other hand, through the inflow pipe 217-1, $Si_2H_6$, $GeH_4$ and $H_2$ gases were introduced into the activation chamber (B) 219. The $Si_2H_6$, $GeH_4$ $H_2$ gases introduced were subjected to activation treatment such as plasma formation by means of the microwave plasma generating device 220 in the activation chamber (B) 219 to become hydrogenated silicon active species, hydrogenated germanium species and activated hydrogen, which were then introduced through the inflow pipe 217-2 into the film forming chamber 201. During this operation, if desired, impurity gases such as $PH_3$, $B_2H_6$, etc. were also activated by introduction into the activation chamber (B) 219.

While maintaining the pressure in the film forming chamber 201 at 1.0 Torr, light was irradiated from the 1 KW Xe lamp vertically onto the circumferential surface of the aluminum cylinder 211.

The aluminum cylinder 211 was rotated, while the discharging gas was discharged through the discharging valve 212. Thus, a photosensitive layer 13 was formed.

Also, the intermediate layer 12 was formed to a film thickness of 2000 Å by introducing a gas mixture of $Si_2H_6$, $GeH_4$, $H_2$ and $B_2H_6$ (0.2% of $B_2H_6$ in terms of vol. %) through the inflow pipe 217-1 prior to formation of the photosensitive layer 13.

COMPARATIVE EXAMPLE 4

According to the plasma CVD method in general, an image forming member for electrophotography having a layer constitution as shown in FIG. 1 was formed by use of respective gases of $GeF_4$ and $Si_2H_6$, $GeH_4$, $H_2$ and $B_2H_6$ by means of the device having the same film forming chamber as the film forming chamber 201 provided with a high frequency means of 13.56 Hz.

The conditions for preparation of the drumshaped image forming members for electrophotography obtained in Example 28 and Comparative example 4 and their performances are shown in Table 2D.

EXAMPLE 29

By means of the device as shown in FIG. 3, with the use of $GeH_4$ as the germanium-containing compound, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $GeF_2^*$ were introduced into the film forming chamber 101 similarly as in Example 24. Also, $Si_3H_6$ gas at 150 SCCM, $GeH_4$ gas at 50 SCCM and $PH_3$ gas (diluted to 1000 ppm with hydrogen gas) were respectively introduced into the activation chamber (B) 123 to be activated. Then, the activated gases were introduced through the inflow pipe 116 into the film forming chamber 101. While maintaining the pressure in the film forming chamber at 0.1 Torr, photoirradiation was effected by a 1 KW Xe lamp to form a n-type A-SiGe(H,X) film 24 (film thickness 700 Å) doped with P.

Next, according to the same method as in formation of the n-type A-SiGe(H,X) film except for introduction of $B_2H_6$ gas (diluted to 300 ppm with hydrogen gas) in place of $PH_3$ gas, an i-type A-SiGe(H,X) film 25 (film thickness: 5000 Å) was formed.

Subsequently, by using $B_2H_6$ gas (diluted to 1000 ppm with hydrogen gas) in place of $PH_3$ gas, following otherwise the same conditions as in the case os n-type, an A-SiGe(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 $cm^2$) was subjected to measurement of I-V characteristic, and rectifying characteristic and photoelectromotive effect were evaluated. The results are shown in Table 3D.

Also, in photoirradiation characteristics, light was introduced from the substrate side, and a conversion efficiency of 7% or higher, an open circuit voltage of 0.89 V and a short circuit current of 11.2 $mA/cm^2$ were obtained at a photoirradiation intensity AMI (about 100 $mW/cm^2$).

EXAMPLES 30–32

Except for using straight chain $Ge_4H_{10}$, branched $Ge_4H_{10}$ in place of $GeH_4$ as the germanium-containing compound, the same PIN type diode as in Example 29 was prepared in the same manner as in Example 29. The rectifying characteristic and photoelectromotive effect were evaluated and the results are shown in Table 3D.

From Table 3D, it can be seen that an A-SiGe(H,X) PIN type diode having better optical and electrical characteristics as compared with the prior art can be obtained according to the present invention.

EXAMPLE 34

By means of the device as shown in FIG. 3, i-type, p-type and n-type oxygen-containing amorphous deposited films were formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 103 before the film forming treatment or, after film formation, for annealing treatment for further improvement of the characteristics of the film formed, and electricity is supplied through a conductive wire 105 to generate heat. During film formation, said heater 104 is not driven.

106 through 109 are gas feeding systems, and they are provided corresponding to oxygen-containing compounds, and the kinds of gases optionally employed such as hydrogen, halogen compounds, inert gases, silicon-containing compounds, carbon-containing compounds, germanium-containing compounds, and compounds containing impurity elements as the component. When these gases employed are liquid under the standard condition, a suitable gasifying device is provided. In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases.

123 is the activation chamber (B) for forming active species (B) and, around the activation chamber 124, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101.

111 is a gas pressure gauge. In the drawing, 112 shows an activation chamber (A), 113 an electric furnace, 114 solid Ge particles and 115 a pipe for introduction of a gaseous compound containing germanium and halogen as the starting material for active species (A). The active species (A) formed in the activation chamber 112 is introduced through the inflow pipe 116 into the film forming chamber 101.

117 is a photoenergy generating device and, for example, a mercury lamp, a xenon lamp, carbon dioxide laser, argon ion laser, excimer laser, etc. may be employed.

The light 118 directed to the substrate as a whole or the desired portion of the substrate 103 by use of the suitable optical system from the light-energy generating device 117 is irradiated on the active species flowing in the direction of the arrowhead 119 to excite the gases for film forming starting materials, thereby causing them to undergo mutually chemical reaction thereby to form an oxygen-containing amorphous deposited film on the whole or the desired portion of the substrate 103. In the drawing, 120 shows a gas discharging valve and 121 a gas discharging pipe.

First, a polyetheneterephthalate film 103 was placed on a supporting stand 102, and the film forming chamber 101 was evacuated by use of an evacuating device to about $10^{-6}$ Torr. By use of a gas feeding source 106, $O_2$ (diluted to 10 vol. % with He) at 150 SCCM or a gas mixture thereof with $PH_3$ gas or $B_2H_6$ gas (each being diluted to 1000 ppm with hydrogen gas) at 40 SCCM was introduced into the activation chamber (B) 123 through the gas inflow pipe 110.

$O_2$ gas, etc. introduced into the activation chamber (B) 123 was activated by means of the microwave plasma generating device 122 to be converted to active oxygen, etc., which were then introduced through the inflow pipe 124 into the film forming chamber 101.

On the other hand, the activation chamber (A) 112 was packed with solid Ge particles 114, heated by the electric furnace 113 to be maintained at about 1100° C., thereby bringing Ge into red hot state, whereinto $GeF_4$ was blown through the inflow pipe 115 from the bomb not shown, thus forming active species of $GeF_2^*$, which were then introduced into the film forming chamber 101 via the inflow pipe 116.

While maintaining the inner pressure in the film forming chamber 101 at 0.4 Torr, irradiation was effected vertically on the substrate 103 from the 1 KW Xe lamp to form a non-doped or doped oxygen-containing amorphous film (film thickness 700 Å). The film forming speed was 22 Å/sec.

Subsequently, the respective non-doped or p-type samples obtained were placed in a vacuum deposition tank, wherein comb-type Al-gap electrodes (length 250μ, width 5 mm) were formed under vacuum of $10^{-5}$ Torr, and the dark electroconductivity $\delta_d$ was determined by measuring dark current at an applied voltage of 10 V for evaluation of the film characteristics of the respective samples. The results are shown in Table 1E.

EXAMPLES 35–37

Except for introducing $O_2$ (diluted to 10 vol. %), $Si_2F_6$, $Ge_2F_6$ and $C_2H_6$ at a use ratio of 1:9, oxygen-containing amorphous deposited films were formed according to the same procedures as in Example 34. The dark electroconductivities were measured to obtain the results shown in Table 1E.

From Table 1E, it can be seen that oxygen-containing amorphous deposited films excellent in electrical characteristics can be obtained according to the present invention.

EXAMPLES 38–41

Following the same procedures as in Example 56, except for using $H_3SiOSiH_3$, $H_3GeOGeH_3$, $CO_2$ or $OF_2$, oxygen-containing amorphous deposited films were formed.

The thus obtained oxyge-containing amorphous deposited films were found to be excellent in electrical characteristics and sufficiently doped.

EXAMPLE 42

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid Ge particles, 205 an inflow pipe for the starting material of active species (A), 206 a pipe for introducing active species (A), 207 a motor, 208 a heater which is used similarly as 104 in FIG. 3, 209 and 210 are blowing pipes, 211 an aluminum cylinder and 212 a gas discharging valve. 213 through 216 are starting gas feeding sources similarly as 106 through 109 in FIG. 3, and 217-1 is a gas introducing pipe.

In the film forming chamber 201, the aluminum cylinder 211 is suspended, equipped internally thereof with the heater 208 so as to be rotatable with the motor 207. 218 is a photoenergy generating device, and light is irradiated toward the desired portion of the aluminum cylinder 211.

Also, the activation chamber (A) 202 is packed with solid Ge particles 204, heated by the electric furnace 203 to bring Ge into red hot state, whereinto $GeF_4$ is blown through the inflow pipe 206 from the bomb not shown to form active species (A) of $GeF_2^*$, which are then introduced into the film forming chamber 201 via the inflow pipe 206.

On the other hand, through the inflow pipe 217-1, the respective gases of $O_2$, $Si_2F_6$ and $H_2$ were introduced into the activation chamber (B) 219. The $O_2$, $Si_2F_6$ and $H_2$ gases introduced were subjected to activation treatment such as plasma formation by means of the microwave plasma generating device 220 in the activation chamber (B) 219 to become activated oxygen, activated hydrogen, activated silicon, etc., which were then introduced through the inflow pipe 217-2 into the film forming chamber 201. During this operation, if desired, impurity gases such as $PH_3$, $B_2H_6$, etc. were also activated by introduction into the activation chamber (B) 220.

While maintaining the pressure in the film forming chamber 201 at 1.0 Torr, light was irradiated from the 1 KW Xe lamp vertically onto the circumferential surface of the aluminum cylinder 211.

The aluminum cylinder 211 was rotated, while the discharging gas was discharged by controlling adequately the opening of the discharging valve 212. Thus, a photosensitive layer 13 was formed.

Also, the intermediate layer 12 was formed before formation of the photosensitive layer to a film thickness of 2000 Å by introducing $Si_2F_6$, $O_2$ ($Si_2F_6:O_2=1:10^{-5}$), He and $B_2H_6$ (0.2% of $B_2H_6$ in terms of vol. %) through the inflow pipe 217-1.

COMPARATIVE EXAMPLE 5

According to the plasma CVD method in general, a drum-shaped image forming member for electrophotography having a layer constitution as shown in FIG. 1 was formed by use of respective gases of $GeF_4$, $Si_2F_6$, $O_2$, He and $B_2H_6$ by means of the device having the same film forming chamber as the film forming chamber 201 provided with a high frequency means of 13.56 MHz.

The conditions for preparation of the drum-shaped image forming members for electrophotography obtained in Example 42 and Comparative example 5 and their performances are shown in Table 2E.

EXAMPLE 43

By means of the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $GeF_2*$ were introduced into the film forming chamber 101 similarly as in Example 24. Also, $Si_2F_6$ gas and $PH_3$ gase (diluted to 1000 ppm with hydrogen gas) were respectively introduced into the activation chamber (B) 123 to be activated.

Then, the activated gases were introduced through the inflow pipe 116 into the film forming chamber 101. While maintaining the pressure in the film forming chamber at 0.3 Torr, photoirradiation was effected by a 1 KW Xe lamp to form a n-type A-SiGe(H,X) film 24 (film thickness 700 Å) doped with P.

Next, according to the same method as in formation of the n-type A-SiGe(H,X) film except for stopping introduction of $PH_3$ gas, a non-doped a-SiGe(H,X) film 25 (film thickness: 5000 Å) was formed.

Subsequently, by using $O_2$ gas and $B_2H_6$ gas (diluted to 1000 ppm with hydrogen gas) together with $Si_2F_6$ gas, following otherwise the same conditions as in the case of n-type, a p-type oxygen-containing a-SiGeO(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 cm²) was subjected to measurement of I-V characteristic, and rectifying characteristic and photoelectromotive effect were evaluated. The results are shown in Table 3E.

Also, in photoirradiation characteristics, light was introduced from the substrate side, and a conversion efficiency of 8.2% or higher, an open circuit voltage of 0.93 V and a short circuit current of 9.8 mA/cm² were obtained at a photoirradiation intensity AMI (about 100 mW/cm²).

EXAMPLES 44-46

Except for using $H_3SiOSiH_3$, $H_3GeOGeH_3$ or $OF_2$ in place of $O_2$ as the oxygen compound, the same PIN type diode as in Example 43 was prepared in the same manner as in Example 43. The rectifying characteristic and photoelectromotive effect were evaluated and the results are shown in Table 3E.

From Table 3E, it can be seen that an oxygen-containing A-SiGe(H,X) PIN type diode having better optical and electrical characteristics as compared with the prior art can be obtained according to the present invention.

EXAMPLE 47

By means of the device as shown in FIG. 3, i-type, p-type and n-type nitrogen-containing amorphous deposited films were formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 103 before the film forming treatment or, after film formation, for annealing treatment for further improvement of the characteristics of the film formed, and electrically is supplied through a conductive wire 105 to generate heat. During film formation, said heater 104 is not driven.

106 through 109 are gas feeding sources, and they are provided corresponding to the nitrogen-containing compounds, and the kinds of gases optionally employed such as hydrogen, halogen compounds, inert gases, silicon-containing compounds, carbon-containing compounds, germanium-containing compounds oxygen containing compound and compounds containing impurity elements as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases.

123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 110 is a gas inflow pipe into the film forming chamber, and 111 is a gas pressure gauge. In the drawing, 112 shows an activation chamber (A), 113 an electric furnace, 114 solid Ge particles and 115 a pipe for introduction of a gaseous compound containing germanium and halogen as the starting material for active species (A). The active species (A) formed in the activation chamber 112 is introduced through the inflow pipe 116 into the film forming chamber 101.

117 is a photoenergy generating device and, for example, a mercury lamp, a xenon lamp, carbon dioxide laser, argon ion laser, excimer laser, etc. may be employed.

The light directed to the substrate as a whole or the desired portion of the substrate 103 by use of a suitable optical system from the light-energy generating device 117 is irradiated on the active species flowing in the direction of the arrowhead 119, and the irradiated active species undergo mutually chemical reaction thereby to form a nitrogen-containing amorphous deposited film on the whole or the desired portion of the substrate 103.

In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device (not shown) to about $10^{-6}$ Torr. From a gas feeding source 106, $N_2$ at 150 SCCM or a gas mixture thereof with $PH_3$ gas or $B_2H_6$ gas (each being diluted to 1000 ppm with hydrogen gas) at 40 SCCM was introduced into the activation chamber (B) 123 through the gas inflow pipe 110. $N_2$ gas, etc. introduced into the activation chamber (B) 123 was activated by means of the microwave plasma generating device 122 to be converted to activated nitrogen, etc., which were then introduced through the inflow pipe 124 into the film forming chamber 101.

On the other hand, the activation chamber (A) 122 was packed with solid Ge particles 114, heated by the electric furnace 113 to be maintained at about 1100° C., thereby bringing Ge into red hot state, whereinto $GeF_4$ was blown through the inflow pipe 115 from the bomb not shown, thus forming active species of $GeF_2^*$, which were then introduced into the film forming chamber 101 via the inflow pipe 116.

While maintaining the inner pressure in the film forming chamber 101 at 0.1 Torr, irradiation was effected vertically on the substrate 103 from the 1 KW Xe lamp to form a nitrogen-containing amorphous deposited film (film thickness 700 Å). The film forming speed was 30 Å/sec.

Subsequently, each of non-doped, p-type and n-type samples obtained was placed in a vacuum deposition tank, wherein a comb-type Al-gap electrode (length 250μ, width 5 mm) was formed under vacuum of $10^{-5}$ Torr, and the dark electroconductivity $\delta_d$ was determined by measuring dark current at an applied voltage of 12 V for evaluation of the film characteristics of the respective samples. The results are shown in Table 1F.

EXAMPLES 48–50

Except for using $Si_2H_6$, $Ge_2H_6$ or $C_2H_6$ together with $H_2$ nitrogen-containing amorphous deposited films were formed according to the same procedures as in Example 47. The dark electroconductivities were measured for respective samples to obtain the results shown in Table 1F.

From Table 1F, it can be seen that nitrogen-containing amorphous films excellent in electrical characteristics can be obtained according to the present invention, and also that nitrogen-containing amorphous deposited films sufficiently doped can be obtained.

EXAMPLES 51–54

In the same manner as in Example 47, except for using $NH_3$, $NOF$, $NO_2$ or $N_2O$ in place of $N_2$, nitrogen-containing amorphous deposited films were formed.

The nitrogen-containing amorphous deposited films were found to be excellent in electrical characteristics and also sufficiently doped.

EXAMPLE 55

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid Si particles, 205 an inflow pipe for the starting material of active species (A), 206 a pipe for introducing active species, 207 a motor, 208 a heater which is used similarly as 104 in FIG. 2, 209 and 210 are blowing pipes, 211 an aluminum cylinder substrate and 212 a gas discharging valve. 213 through 216 are starting gas feeding sources similarly as 106 through 109 in FIG. 3, and 217-1 is a gas introducing pipe.

In the film forming chamber 201, the aluminum cylinder 211 was suspended, equipped internally thereof with the heater 208 so as to be rotatable with the motor 207. 218 is a photoenergy generating device, and light was irradiated toward the desired portion of the aluminum cylinder 211.

Also, the activation chamber (A) 202 was packed with solid Ge particles 204, heated by the electric furnace 203 to be maintained at about 1100° C. to bring Ge into red hot state, whereinto $GeF_4$ was blown into to form active species of $GeF_2^*$, which were then introduced into the film forming chamber 201 via the inflow pipe 206.

On the other hand, through the inflow pipe 217-1, respective gases of $Si_2H_6$ and $N_2$ were introduced into the activation chamber (B) 219. The $Si_2H_6$ and $N_2$ gases introduced were subjected to activation treatment such as plasma formation by means of the microwave plasma generating device 220 in the activation chamber (B) 219 to become activated hydrogenated silicon and activated hydrogen, which were then introduced through the inflow pipe 217-2 into the film forming chamber 201. During this operation, if desired, impurity gases such as $PH_3$, $B_2H_6$, etc. were also introduced into the activation chamber (B) 220 to be activated. While maintaining the pressure in the film forming chamber 201 at 1.0 Torr, light was irradiated from the 1 KW Xe lamp 218 vertically onto the circumferential surface of the aluminum cylinder 211.

The aluminum cylinder 211 was rotated, while the discharging gas was discharged through the discharging valve 212. Thus, photosensitive layer 13 was formed.

Also, the intermediate layer 12 was formed before formation of the photosensitive layer 13 to a film thickness of 2000 Å by introducing a gas mixture of $Si_2H_6$, $N_2$, $H_2$ and $B_2H_6$ (0.2% of $B_2H_6$ in terms of vol. %) in addition to the gases employed in preparation of the photosensitive layer 13 through the inflow pipe 217-1.

COMPARATIVE EXAMPLE 6

According to the plasma CVD method in general, an image forming member for electrophotography having a layer constitution as shown in FIG. 1C was formed by use of respective gases of $GeF_4$, $Si_2H_6$, $N_2$, and $H_2$ and $B_2H_6$ by means of the device having the same film forming chamber as the film forming chamber 201 provided with a high frequency generator of 13.56 MHz.

The conditions for preparation of the drum-shaped image forming members for electrophotography obtained in Example 55 and Comparative example 6 and their performances are shown in Table 2F.

EXAMPLE 56

By use of $N_2$ as the nitrogen compound, by means of the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $GeF_2^*$ formed similarly as in Example 47 were introduced into the film forming chamber 101. Also, $Si_3H_6$ gas and $PH_3$ gas (diluted to 1000 ppm with hydrogen gas) were respectively introduced into the activation chamber (B) 123 to be activated. Then, the activated gases were introduced through the inflow pipe 116 into the film forming chamber 101. While maintaining the pressure in the film forming chamber at 0.4 Torr, photoirradiation was effected by a 4 KW Xe lamp to form a n-type A-SiGeN(H,X) film 24 (film thickness 700 Å) doped with P.

Next, according to the same method as in formation of the n-type A-Si(H,X) film except for stopping introduction of $PH_3$ gas, a non-doped A-SiGeN(H,X) film 25 (film thickness: 5000 Å) was formed.

Subsequently, by using $N_2$ gas and $B_2H_6$ gas (diluted to 1000 ppm with hydrogen gas) together with $Si_2H_6$ gas, following otherwise the same conditions as in the case of n-type, a p-type A-SiGeN(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 $cm^2$) was subjected to measurement of I-V characteristic, and rectifying characteristic and photoelectromotive effect were evaluated. The results are shown in Table 3F.

Also, in photoirradiation characteristics, light was introduced from the substrate side, and a conversion efficiency of 8.4% or higher, an open circuit voltage of 0.9 V and a short circuit current of 10.2 $mA/cm^2$ were obtained at a photoirradiation intensity AMI (about 100 $mW/cm^2$).

EXAMPLES 57-59

Except for using NO, $N_2O$, $N_2O_4$ in place of $N_2$ as the nitrogen compound, the same PIN type diode as in Example 56 was prepared in the same manner as in Example 56. The rectifying characteristic and photoelectromotive effect were evaluated and the results are shown in Table 3F.

TABLE 1A

|  | Example 1 | Example 2 |
|---|---|---|
| Starting gas for formation of active species (B) | $H_2$ | $H_2/F_2$ |
| $\sigma_d$ (Non-doped) $(\Omega \cdot cm)^{-1}$ | $8.8 \times 10^{-4}$ | $7.6 \times 10^{-4}$ |
| $\sigma_d$ (B doped) $(\Omega \cdot cm)^{-1}$ | $7.1 \times 10^{-3}$ | $3.3 \times 10^{-3}$ |
| $\sigma_d$ (P doped) $(\Omega \cdot cm)^{-1}$ | $6.7 \times 10^{-3}$ | $7.2 \times 10^{-3}$ |

TABLE 2A

|  | Example 3 | Comparative example 1 |
|---|---|---|
| Starting gas for formation of active species (A) | $GeF_4/SiF_4$ |  |
| Activation temperature | 1000° C. |  |
| Main decomposed active species | $GeF_2^*$ $SiF_2^*$ |  |
| Starting gas for formation of active species (B) | $H_2$ |  |
| Inflow amount from activation chamber (A) | 200 SCCM |  |
| Inflow amount from activation chamber (B) | 100 SCCM |  |
| Inflow amount from starting gas bomb |  | $GeF_4$ 100 SCCM $SiF_4$ 200 SCCM $H_2$ 100 SCCM |
| Inner pressure in film forming chamber | 0.8 Torr | 1.0 Torr |
| Film forming rate | 17.5 Å/sec | 5 Å/sec |
| RF discharging power |  | 1.8 $W/cm^2$ |
| Layer thickness of photosensitive layer 13 | 22μ | 22μ |
| Average number of image defects in 10 drum-shaped image forming members for electrophotography | 3 | 21 |
| Acceptance potential irregularity in circumferential direction | ±12 V | ±35 V |
| Acceptance potential irregularity in axial direction | ±17 V | ±40 V |
| Remarks | Example according to the process of this invention | Example according to plasma CVD of the prior art Substrate temperature 250° C. |

TABLE 3A

|  | Example 4 | Example 5 |
|---|---|---|
| Gas for film formation starting gas | $H_2$ | $H_2/F_2$ |
| Rectifying ratio of diode (*1) | $5.5 \times 10^2$ | $4.8 \times 10^2$ |
| $\eta$ value of diode (*2) | 1.3 | 1.4 |

(*1) Ratio of forward current to reverse current at voltage 1 V
(*2) $\eta$ value (Quality Factor) in the current formula of p − n junction:

$$J = J_s \left\{ \exp\left(\frac{eV}{nRT}\right) - 1 \right\}$$

TABLE 1B

|  | Example 6 | Example 7 | Example 8 | Example 9 |
|---|---|---|---|---|
| Starting gas for formation of active species (B) | $Si_5H_{10}$ | $Si_4H_{10}$ | $SiH_3SiH(SiH_3)SiH_3$ | $H_6Si_6F_6$ |
| $\delta_d$ (Non-doped) $(\Omega \cdot cm)^{-1}$ | $6.6 \times 10^{-9}$ | $7.3 \times 10^{-9}$ | $5.5 \times 10^{-9}$ | $4.7 \times 10^{-9}$ |
| $\delta_d$ (B doped) $(\Omega \cdot cm)^{-1}$ | $7.3 \times 10^{-6}$ | $5.3 \times 10^{-6}$ | $5.6 \times 10^{-6}$ | $3.8 \times 10^{-6}$ |
| $\delta_d$ (P doped) $(\Omega \cdot cm)^{-1}$ | $5.5 \times 10^{-6}$ | $8.2 \times 10^{-6}$ | $6.1 \times 10^{-6}$ | $4.0 \times 10^{-6}$ |

TABLE 2B

|  | Example 10 | Comparative example 2 |
|---|---|---|
| Starting gas for formation of active species (A) | $GeF_4$ | |
| Decomposition temperature | 1100° C. | |
| Main decomposed active species | $GeF_2^*$ | |
| Starting gas for formation | $Si_2H_6/H_2$ | |
| Inflow amount from activation chamber (A) | 200 SCCM | |
| Inflow amount from activation chamber (B) | 100 SCCM | |
| Inflow amount from starting gas bomb | | $GeF_4$ 200 SCCM $Si_2H_6$ 100 SCCM $H_2$ 100 SCCM |
| Inner pressure in film forming chamber | 1.0 Torr | 1.0 Torr |
| Film forming rate | 19 Å/sec | 6 Å/sec |
| RF discharging power | | 1.8 $W/cm^2$ |
| Layer thickness of photosensitive layer 13 | 22μ | 22μ |
| Average number of image defects in 10 drum-shaped image forming members for electrophotography | 3 | 16 |
| Acceptance potential irregularity in circumferential direction | ±9 V | ±31 V |
| Acceptance potential irregularity in axial direction | ±15 V | ±35 V |
| Remarks | Example according to the process of this invention | Example according to plasma CVD of the prior art Substrate temperature 250° C. |

TABLE 3B

|  | Example 11 | Example 12 | Example 13 | Example 14 |
|---|---|---|---|---|
| Gas for film formation starting gas | $Si_3H_6$ | $Si_4H_{10}$ | $SiH_3SiH—(SiH_3)—SiH_3$ | $H_6Ge_6F_6$ |
| Rectifying ratio of diode (*1) | $7 \times 10^2$ | $6 \times 10^2$ | $8.3 \times 10^2$ | $7.7 \times 10^2$ |
| $\eta$ value of diode (*2) | 1.1 | 1.4 | 1.5 | 1.3 |

(*1) Ratio of forward current to reverse current at voltage 1 V
(*2) $\eta$ value (Quality Factor) in the current formula of p − n junction:

$$J = J_s \left\{ \exp\left(\frac{eV}{nRT}\right) - 1 \right\}$$

TABLE 1C

|  | Example 15 | Example 16 | Example 17 | Example 18 |
|---|---|---|---|---|
| Starting gas for formation of active species (B) | $CH_4$ | $C_2H_6$ | $C_2H_4$ | $C_2H_2$ |
| $\delta_d$ (Non-doped) $(\Omega \cdot cm)^{-1}$ | $6.8 \times 10^{-9}$ | $4.4 \times 10^{-9}$ | $4.8 \times 10^{-9}$ | $3.2 \times 10^{-9}$ |
| $\delta_d$ (B doped) $(\Omega \cdot cm)^{-1}$ | $6.8 \times 10^{-6}$ | $3.5 \times 10^{-6}$ | $4.3 \times 10^{-6}$ | $4.1 \times 10^{-6}$ |
| $\delta_d$ (P doped) $(\Omega \cdot cm)^{-1}$ | $5.0 \times 10^{-6}$ | $4.8 \times 10^{-6}$ | $5.2 \times 10^{-6}$ | $5.9 \times 10^{-6}$ |

TABLE 2C

|  | Example 19 | Comparative example 3 |
|---|---|---|
| Starting gas for formation of active species (A) | $GeF_4$ | |
| Activation temperature | 1100° C. | |
| Main active species | $GeF_2$* | |
| Starting gas for formation of active species (B) | $CH_4/Si_2H_6/H_2$ Volume ratio 0.1:2:0.1 | |
| Inflow amount from activation chamber (A) | 210 SCCM | |
| Inflow amount from activation chamber (B) | 120 SCCM | |
| Inflow amount from starting gas bomb | | $GeF_4$ 200 SCCM $CH_4$ 50 SCCM $Si_2H_6$ 100 SCCM $H_2$ 100 SCCM |
| Inner pressure in film forming chamber | 1.0 Torr | 1.0 Torr |
| Film forming rate | 16 Å/sec | 5 Å/sec |
| RF discharging power | | 1.5 W/cm² |
| Layer thickness of photosensitive layer 13 | 23μ | 23μ |
| Average number of image defects in 10 drum-shaped image forming members for electrophotography | 3 | 16 |
| Acceptance potential irregularity in circumferential direction | ±8 V | ±30 V |
| Acceptance potential irregularity in axial direction | ±16 V | ±35 V |
| Remarks | Example according to the process of this invention | Example according to plasma CVD of the prior art Substrate temperature 250° C. |

TABLE 3C

|  | Example 20 | Example 21 | Example 22 | Example 23 |
|---|---|---|---|---|
| Starting gas for formation of active species (B) | $CH_4$ | $C_2H_6$ | $C_2H_4$ | $C_2H_2$ |
| Rectifying ratio of diode (1*) | $5 \times 10^2$ | $7 \times 10^2$ | $6.5 \times 10^2$ | $5.5 \times 10^2$ |
| η value of diode (*2) | 1.3 | 1.35 | 1.4 | 1.25 |

(*1) Ratio of forward current to reverse current at voltage 1 V
(*2) η value (Quality Factor) in the current formula of p − n junction:

$$J = J_s \left\{ \exp\left(\frac{eV}{nRT}\right) - 1 \right\}$$

TABLE 1D

|  | Example 24 | Example 25 | Example 26 | Example 27 |
|---|---|---|---|---|
| Starting gas for formation of active species (B) | $GeH_4$ | Straight chain $Ge_4H_{10}$ | Branched $Ge_4H_{10}$ | $H_6Ge_6F_6$ |
| $\delta_d$ (Non-doped) $(\Omega \cdot cm)^{-1}$ | $9.1 \times 10^{-4}$ | $7.7 \times 10^{-4}$ | $8.1 \times 10^{-4}$ | $6.5 \times 10^{-4}$ |
| $\delta_d$ (B doped) $(\Omega \cdot cm)^{-1}$ | $8 \times 10^{-3}$ | $4 \times 10^{-3}$ | $3.6 \times 10^{-3}$ | $7.0 \times 10^{-3}$ |
| $\delta_d$ (P doped) $(\Omega \cdot cm)^{-1}$ | $9 \times 10^{-3}$ | $5 \times 10^{-3}$ | $4 \times 10^{-3}$ | $7.5 \times 10^{-3}$ |

TABLE 2D

|  | Example 28 | Comparative example 4 |
|---|---|---|
| Starting gas for formation of active species (A) | $GeF_4$ | |
| Activation temperature | 1100° C. | |
| Main decomposed active species | $GeF_2$* | |
| Starting gas for formation of active species (B) | $Si_2H_6$/ $GeH_4/H_2$ | |
| Inflow amount from activation chamber (A) | 250 SCCM | |
| Inflow amount from activation chamber (B) | 150 SCCM | |
| Inflow amount from starting gas bomb | | $GeF_4$ 200 SCCM $Si_2H_6$ 100 SCCM $GeH_4$ 50 SCCM $H_2$ 100 SCCM |
| Inner pressure in film forming chamber | 1.0 Torr | 1.0 Torr |
| Film forming rate | 20 Å/sec | 5 Å/sec |
| RF discharging power | | 0.19 W/cm$^2$ |
| Layer thickness of photosensitive layer 13 | 23μ | 23μ |
| Average number of image defects in 10 drum-shaped image forming members for electrophotography | 5 | 26 |
| Acceptance potential irregularity in circumferential direction | ±13 V | ±35 V |
| Acceptance potential irregularity in axial direction | ±17 V | ±40 V |
| Remarks | Example according to the process of this invention | Example according to plasma CVD of the prior art Substrate temperature 250° C. |

TABLE 3D

|  | Example 29 | Example 30 | Example 31 | Example 32 |
|---|---|---|---|---|
| Starting gas for formation of active species (B) | $GeH_4$ | Straight chain $Ge_4H_{10}$ | Branched $Ge_4H_{10}$ | $H_6Ge_6F_6$ |
| Rectifying ratio of diode (*1) | $7.6 \times 10^2$ | $7.7 \times 10^2$ | $7.3 \times 10^2$ | $8.0 \times 10^2$ |
| η value of diode (*2) | 1.31 | 1.21 | 1.28 | 1.36 |

(*1) Ratio of forward current to reverse current at voltage 1 V
(*2) η value (Quality Factor) in the current formula of p − n junction:

$$J = Js\left\{ \exp\left(\frac{eV}{nRT}\right) - 1 \right\}$$

TABLE 1E

|  | Example 34 | Example 35 | Example 36 | Example 37 |
|---|---|---|---|---|
| Starting gas for formation of active species (B) | $O_2$/He | $O_2$/He/ $Si_2H_6$ | $O_2$/He/ $Ge_2H_6$ | $O_2$/He/ $C_2H_6$ |
| $δ_d$ (Non-doped) $(Ω·cm)^{-1}$ | $3.5 \times 10^{-9}$ | $1.5 \times 10^{-9}$ | $4.3 \times 10^{-9}$ | $7.1 \times 10^{-10}$ |
| $δ_d$ (B doped) $(Ω·cm)^{-1}$ | $8.4 \times 10^{-6}$ | $9.5 \times 10^{-6}$ | $8.9 \times 10^{-6}$ | $3.3 \times 10^{-7}$ |
| $δ_d$ (P doped) $(Ω·cm)^{-1}$ | $9.0 \times 10^{-6}$ | $1.0 \times 10^{-5}$ | $9.5 \times 10^{-6}$ | $3.5 \times 10^{-7}$ |

TABLE 2E

|  | Example 42 | Comparative example 5 |
|---|---|---|
| Starting gas for formation of active species (A) | $GeF_4$ | |
| Activation temperature | 1100° C. | |
| Main active species | $GeF_2$* | |
| Starting gas for formation of active species (B) | $Si_2F_6$/ $O_2/H_e$ | |
| Inflow amount from activation chamber (A) | 250 SCCM | |
| Inflow amount from | 150 SCCM | |

TABLE 2E-continued

|  | Example 42 | Comparative example 5 |
|---|---|---|
| activation chamber (B) | | |
| Inflow amount from starting gas bomb | | $GeF_4$ 200 SCCM<br>$Si_2F_6$ 100 SCCM<br>$O_2(Si_2H_6$:<br>$O_2 = 1:10^5)$<br>He 100 SCCM |
| Inner pressure in film forming chamber | 1.0 Torr | 1.0 Torr |
| Film forming rate | 20 Å/sec | 5 Å/sec |
| RF discharging power | | 1.6 W/cm² |
| Layer thickness of photosensitive layer 13 | 25μ | 25μ |
| Average number of image defects in 10 drum-shaped image forming members for electrophotography | 3 | 20 |
| Acceptance potential irregularity in circumferential direction | ±9 V | ±30 V |
| Acceptance potential irregularity in axial direction | ±14 V | ±35 V |
| Remarks | Example according to the process of this invention | Example according to plasma CVD of the prior art Substrate temperature 250° C. |

TABLE 3E

|  | Example 43 | Example 44 | Example 45 | Example 46 |
|---|---|---|---|---|
| Starting gas for formation of active species (B) | $O_2$ | $H_3SiOSiH_3$ | $H_3GeOGeH_3$ | $OF_2$ |
| Rectifying ratio of diode (*1) | $4 \times 10^2$ | $7 \times 10^2$ | $6 \times 10^2$ | $5 \times 10^2$ |
| η value of diode (*2) | 1.4 | 1.3 | 1.2 | 1.3 |

(*1) Ratio of forward current to reverse current at voltage 1 V
(*2) η value (Quality Factor) in the current formula of p − n junction:

$$J = J_s \left\{ \exp\left(\frac{eV}{nRT}\right) - 1 \right\}$$

TABLE 1F

|  | Example 47 | Example 48 | Example 49 | Example 50 |
|---|---|---|---|---|
| Starting gas for formation of active species (B) | $N_2$ | $N_2/Si_2H_6$ | $N_2/Ge_2H_6$ | $N_2/C_2H_6$ |
| $\delta_d$ (Non-doped) $(\Omega \cdot cm)^{-1}$ | $5.0 \times 10^{-9}$ | $8.0 \times 10^{-9}$ | $4.5 \times 10^{-9}$ | $6.6 \times 10^{-10}$ |
| $\delta_d$ (B doped) $(\Omega \cdot cm)^{-1}$ | $1 \times 10^{-6}$ | $5.0 \times 10^{-6}$ | $4.1 \times 10^{-6}$ | $8.8 \times 10^{-7}$ |
| $\delta_d$ (P doped) $(\Omega \cdot cm)^{-1}$ | $7 \times 10^{-6}$ | $5.0 \times 10^{-5}$ | $1.1 \times 10^{-5}$ | $6 \times 10^{-6}$ |

TABLE 2F

|  | Example 55 | Comparative example 6 |
|---|---|---|
| Starting gas for formation of active species (A) | $GeF_4$ | |
| Activation temperature | 1100° C. | |
| Main active species | $GeF_2^*$ | |
| Starting gas for formation of active species (B) | $Si_2H_6/$ $N_2/H_2$ | |
| Inflow amount from activation chamber (A) | 210 SCCM | |
| Inflow amount from activation chamber (B) | 100 SCCM | |
| Inflow amount from starting gas bomb | | $GeF_4$ 200 SCCM<br>$Si_2H_6$ 100 SCCM<br>$N_2$ 50 SCCM<br>$H_2$ 100 SCCM |
| Inner pressure in film forming chamber | 1.0 Torr | 1.0 Torr |
| Film forming rate | 15 Å/sec | 5 Å/sec |
| RF discharging power | | 1.9 W/cm² |
| Layer thickness of photosensitive layer 13 | 22μ | 22μ |
| Average number of image defects in 10 drum-shaped image forming members for electrophotography | 2 | 20 |

TABLE 2F-continued

|  | Example 55 | Comparative example 6 |
|---|---|---|
| Acceptance potential irregularity in circumferential direction | ±10 V | ±30 V |
| Acceptance potential irregularity in axial direction | ±15 V | ±36 V |
| Remarks | Example according to the process of this invention | Example according to plasma CVD of the prior art Substrate temperature 250° C. |

TABLE 3F

|  | Example 56 | Example 57 | Example 58 | Example 59 |
|---|---|---|---|---|
| Starting gas for formation of active species (B) | $N_2$ | NO | $N_2O$ | $N_2O_4$ |
| Rectifying ratio of diode (*1) | $4.2 \times 10^2$ | $4.8 \times 10^2$ | $5.7 \times 10^2$ | $9.0 \times 10^2$ |
| η value of diode (*2) | 1.2 | 1.3 | 1.4 | 1.1 |

(*1) Ratio of forward current to reverse current at voltage 1 V
(*2) η value (Quality Factor) in the current formula of p — n junction:

$$J = J_s \left\{ \exp\left(\frac{eV}{nRT}\right) - 1 \right\}$$

What is claimed is:

1. A process for forming a deposited film, which comprises introducing into a film forming space housing a substrate therein an active species (A) formed by decomposition of a compound containing germanium and a halogen and an active species (B) formed from a chemical substance for film formation which is reactive with said active species (A) separately from each other, then irradiating them with light energy and thereby allowing both the species to react with each other thereby to form a deposited film on the substrate.

2. A process according to claim 1, wherein said active species (B) is formed from hydrogen and/or a halogen compound.

3. A process according to claim 1, wherein said active species (B) is formed from a silicon containing compound.

4. A process according to claim 1, wherein said active species (B) is formed from a carbon containing compound.

5. A process according to claim 1, wherein said active species (B) is formed from a germanium containing compound.

6. A process according to claim 1, wherein said active species (B) is formed from an oxygen containing compound.

7. A process according to claim 1, wherein said active species (B) is formed from a nitrogen containing compound.

8. A process according to claim 1, wherein said active species (A) is formed by decomposition of a chain or cyclic hydrogenated germanium of which hydrogen atoms are partially or wholly substituted with halogen atoms.

9. A process according to claim 8, wherein said active species (B) is formed from hydrogen and/or a halogen compound.

10. A process according to claim 8, wherein said active species (B) is formed from a silicon containing compound.

11. A process according to claim 8, wherein said active species (B) is formed from a carbon containing compound.

12. A process according to claim 8, wherein said active apecies (B) is formed from a germanium containing compound.

13. A process according to claim 8, wherein said active species (B) is formed from an oxygen containing compound.

14. A process according to claim 8, wherein said active species (B) is formed from a nitorgen containing compound.

15. A process according to claim 1, wherein an active species (SX) formed by decomposition of a compound containing silicon and a halogen and/or an active species (CX) formed by decomposition of a compound containing carbon and a halogen is used in addition to said active species (A).

16. A process according to claim 15, wherein said active species (B) is formed from hydrogen and/or a halogen compound.

17. A process according to claim 15, wherein said active species (B) is formed from a silicon containing compound.

18. A process according to claim 15, wherein said active species (B) is formed from a carbon containing compound.

19. A process according to claim 15, wherein said active species (B) is formed from a germanium containing compound.

20. A process according to claim 15, wherein said active species (B) is formed from an oxygen containing compound.

21. A process according to claim 15, wherein said active species (B) is formed from a nitrogen containing compound.

22. A process according to claim 1, wherein the proportion in amount of said active species (A) to said active species (B) introduced into the film forming space is 10:1 to 1:10.

23. A process according to claim 1, wherein the life of said active species (A) is 0.1 second or longer.

* * * * *

UNITED STATES PATENT AND TRADEMARK OFFICE
CERTIFICATE OF CORRECTION

PATENT NO. : 4,726,963
DATED : February 23, 1988
INVENTOR(S) : SHUNICHI ISHIHARA, ET AL.

Page 1 of 4

It is certified that error appears in the above-identified patent and that said Letters Patent is hereby corrected as shown below:

COLUMN 1

Line 46, "of" should read --to--.

COLUMN 6

Line 56, "dichlorofuloromethylsilane" should read --dichlorofluoromethylsilane--.
Line 57, "chlorofulorodimethylsilane" should read --chlorofluorodimethylsilane--.

COLUMN 7

Line 14, "triethylfulorosilane" should read --triethylfluorosilane--.

COLUMN 8

Line 1, "containing" should read --containing compounds--.
Line 12, "oxygen" should read --containing oxygen--.
Line 28, "organoacetoxylilanes" should read --organoacetoxysilanes--.
Line 36, "comounds" should read --compounds--.
Line 57, "chamical" should read --chemical--.

COLUMN 9

Line 41, "chamical" should read --chemical--.

UNITED STATES PATENT AND TRADEMARK OFFICE
CERTIFICATE OF CORRECTION

PATENT NO. : 4,726,963

DATED : February 23, 1988

INVENTOR(S) : SHUNICHI ISHIHARA, ET AL.

Page 2 of 4

It is certified that error appears in the above-identified patent and that said Letters Patent is hereby corrected as shown below:

COLUMN 11

Line 9, "electroconducitve" should read --electroconductive--.

COLUMN 12

Lines 26-27, "halogen germanium," should read --halogen, germanium,--.

Line 39, "Asi(H,X,Ge,C), Asi(H,X,Ge,C)," should read --A-Si(H,X,Ge,C),--.

COLUMN 16

Line 7, "$\theta_d$" should read --$\sigma_d$--.

COLUMN 17

Line 54, "b" should read --B--.

COLUMN 18

Line 22, "substrate 104" should read --substrate 103--.

COLUMN 19

Line 11, "arrowhead" should read --arrow-head--.

COLUMN 25

Line 43, "gauses" should read --gauges--.

UNITED STATES PATENT AND TRADEMARK OFFICE
CERTIFICATE OF CORRECTION

PATENT NO. : 4,726,963
DATED : February 23, 1988
INVENTOR(S) : SHUNICHI ISHIHARA, ET AL.

It is certified that error appears in the above-identified patent and that said Letters Patent is hereby corrected as shown below:

COLUMN 26

Line 24, "122" should read --112--.

COLUMN 29

Line 8, "124," should read --123,--.

COLUMN 37

Table 2B, "Starting gas for formation"
            Inflow amount from
should read --Starting gas for formation--.
        of active species (B)
        Inflow amount from

COLUMN 45

Table 2F Cont., "=10 V    =30 V"
              =15 V    =36 V
should read --$\pm$10 V    $\pm$30 V--.
              $\pm$15 V    $\pm$36 V

UNITED STATES PATENT AND TRADEMARK OFFICE
CERTIFICATE OF CORRECTION

PATENT NO. : 4,726,963
DATED : February 23, 1988
INVENTOR(S) : SHUNICHI ISHIHARA, ET AL.

It is certified that error appears in the above-identified patent and that said Letters Patent is hereby corrected as shown below:

COLUMN 46

Line 24, "apecies" should read --species--.
Line 30, "nitorgen" should read --nitrogen--.

Signed and Sealed this

Sixth Day of December, 1988

Attest:

DONALD J. QUIGG

Attesting Officer

Commissioner of Patents and Trademarks